United States Patent
Tsai et al.

(10) Patent No.: US 12,362,329 B2
(45) Date of Patent: Jul. 15, 2025

(54) METHOD OF FABRICATING SEMICONDUCTOR PACKAGE

(71) Applicant: Taiwan Semiconductor Manufacturing Company, Ltd., Hsinchu (TW)

(72) Inventors: Hao-Yi Tsai, Hsinchu (TW); Cheng-Chieh Hsieh, Tainan (TW); Tsung-Hsien Chiang, Hsinchu (TW); Hui-Chun Chiang, Hsinchu (TW); Tzu-Sung Huang, Tainan (TW); Ming-Hung Tseng, Miaoli County (TW); Kris Lipu Chuang, Hsinchu (TW); Chung-Ming Weng, Taichung (TW); Tsung-Yuan Yu, Taipei (TW); Tzuan-Horng Liu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/429,471

(22) Filed: Feb. 1, 2024

(65) Prior Publication Data
US 2024/0234375 A1    Jul. 11, 2024

Related U.S. Application Data

(62) Division of application No. 17/460,340, filed on Aug. 30, 2021, now Pat. No. 11,935,871.

(51) Int. Cl.
*H01L 23/00* (2006.01)
*H01L 25/00* (2006.01)
(Continued)

(52) U.S. Cl.
CPC .......... *H01L 25/0657* (2013.01); *H01L 24/02* (2013.01); *H01L 24/03* (2013.01);
(Continued)

(58) Field of Classification Search
CPC .... H01L 25/0657; H01L 24/03; H01L 25/105
See application file for complete search history.

(56) References Cited

U.S. PATENT DOCUMENTS

| | | | | |
|---|---|---|---|---|
| 9,666,502 B2* | 5/2017 | Chen | ................. | H01L 21/76831 |
| 10,510,650 B2* | 12/2019 | Yu | ....................... | H01L 23/5383 |

(Continued)

FOREIGN PATENT DOCUMENTS

| | | |
|---|---|---|
| TW | 202040786 | 11/2020 |
| TW | 202101685 | 1/2021 |
| TW | 202127595 | 7/2021 |

OTHER PUBLICATIONS

"Office Action of Taiwan Counterpart Application", issued on Jan. 22, 2025, p. 1-p. 4.

*Primary Examiner* — Dale E Page
*Assistant Examiner* — Wilner Jean Baptiste
(74) *Attorney, Agent, or Firm* — JCIPRNET

(57) ABSTRACT

A semiconductor package including a first semiconductor die, a second semiconductor die, a first insulating encapsulation, a dielectric layer structure, a conductor structure and a second insulating encapsulation is provided. The first semiconductor die includes a first semiconductor substrate and a through substrate via (TSV) extending from a first side to a second side of the semiconductor substrate. The second semiconductor die is disposed on the first side of the semiconductor substrate. The first insulating encapsulation on the second semiconductor die encapsulates the first semiconductor die. A terminal of the TSV is coplanar with a surface of the first insulating encapsulation. The dielectric layer structure covers the first semiconductor die and the first insulating encapsulation. The conductor structure extends through the dielectric layer structure and contacts with the through substrate via. The second insulating encap- (Continued)

sulation contacts with the second semiconductor die, the first insulting encapsulation, and the dielectric layer structure.

20 Claims, 28 Drawing Sheets

(51) Int. Cl.
 *H01L 25/065* (2023.01)
 *H01L 25/10* (2006.01)
(52) U.S. Cl.
 CPC .............. *H01L 24/05* (2013.01); *H01L 24/08* (2013.01); *H01L 25/105* (2013.01); *H01L 25/50* (2013.01); H01L 24/06 (2013.01); H01L 24/73 (2013.01); H01L 2224/02141 (2013.01); H01L 2224/0311 (2013.01); H01L 2224/0312 (2013.01); H01L 2224/05559 (2013.01); H01L 2224/0557 (2013.01); H01L 2224/05573 (2013.01); H01L 2224/05647 (2013.01); H01L 2224/06135 (2013.01); H01L 2224/08225 (2013.01); H01L 2224/73204 (2013.01); H01L 2225/06513 (2013.01); H01L 2225/06544 (2013.01); H01L 2225/06548 (2013.01); H01L 2225/06586 (2013.01); H01L 2225/1035 (2013.01); H01L 2225/1058 (2013.01)

(56) References Cited

U.S. PATENT DOCUMENTS

2019/0244947 A1\* 8/2019 Yu ........................... H01L 24/92
2019/0371763 A1\* 12/2019 Agarwal ................ H01L 24/81

\* cited by examiner

METHOD OF FABRICATING SEMICONDUCTOR PACKAGE

CROSS-REFERENCE TO RELATED APPLICATION

This application is a divisional application of and claims the priority benefit of U.S. application Ser. No. 17/460,340, filed on Aug. 30, 2021, now allowed. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
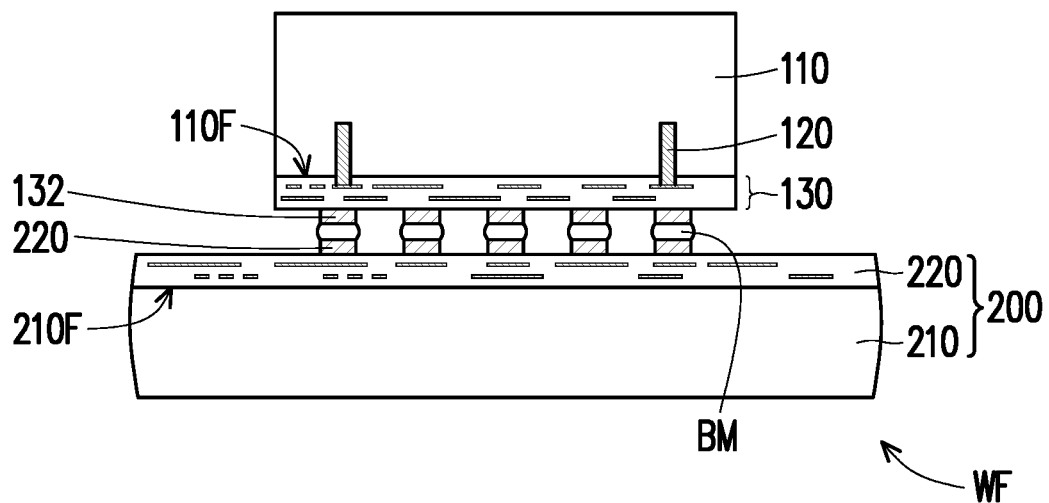
FIG. 1A through FIG. 1G are cross-sectional views schematically illustrating a process flow for fabricating a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G are cross-sectional views schematically illustrating a process flow for fabricating a semiconductor package in accordance with some embodiments of the present disclosure.

In FIG. 1A, a first semiconductor substrate 110 having a through silicon via 120 therein is singulated from a first semiconductor wafer (not shown) and attached to a second semiconductor substrate 210 of a second semiconductor wafer WF. The first semiconductor substrate 110 may be a semiconductor substrate, such as a silicon substrate, including active components (e.g., transistors or the like) and passive components (e.g., resistors, capacitors, inductors, or the like) formed therein, for example at a front side 110F of the first semiconductor substrate 110. The active components and passive components are formed in the first semiconductor substrate 110 through front end of line (FEOL) fabrication processes of a semiconductor wafer. In addition, an interconnect circuit structure 130 is formed at the front side 110F of the first semiconductor substrate 110. The interconnect circuit structure 130 may be electrically connected to the through silicon via 120, but the disclosure is not limited thereto. The interconnect circuit structure 130 may include interconnect wirings (e.g., copper interconnect wirings) and dielectric layer stacked alternately, wherein the interconnect wirings of the interconnect circuit structure 130 are electrically connected to the active components and/or the passive components in the first semiconductor substrate 110. The interconnect circuit structure 130 is formed through back end of line (BEOL) fabrication processes of the semiconductor wafer. The outermost interconnect wirings in the interconnect circuit structure 130 may include conductive pads 132, and the conductive pads 132 may be aluminum pads, copper pads, or other suitable metallic pads.

The second semiconductor substrate 210 may be a semiconductor substrate, such as a silicon substrate, including active components (e.g., transistors or the like) and passive components (e.g., resistors, capacitors, inductors, or the like) formed therein. The active components and passive components are formed in the second semiconductor substrate 210 through front end of line (FEOL) fabrication processes of the semiconductor wafer and construct logic circuits, memory or a combination thereof. An interconnect circuit structure 220 is formed at a front side 210F of the second semiconductor substrate 210. The interconnect circuit structure 220 may include interconnect wirings (e.g., copper interconnect wirings) and dielectric layer stacked alternately, wherein the interconnect wirings of the interconnect circuit structure 220 are electrically connected to the active components and/or the passive components in the second semiconductor substrate 210. The interconnect circuit structure 220 is formed through back end of line (BEOL) fabrication processes of the semiconductor wafer. The outermost interconnect wirings in the interconnect circuit structure 220 may include conductive pads 222, and the conductive pads 222 may be aluminum pads, copper pads, or other suitable metallic pads.

The first semiconductor substrate 110 may be connected to the second semiconductor substrate 210 through electric connectors BM. The connectors BM may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors BM may include a conductive material such as solder, copper, aluminum, gold, nickel, silver, palladium, tin, the like, or a combination thereof. In some embodiments, the connectors BM include a eutectic material and may include a solder bump or a solder ball, as examples. In some embodiments, the connectors BM include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

In some embodiments, micro bumps may be respectively formed on the interconnect circuit structure 130 and the interconnect circuit structure 222 in advance. For example, the first semiconductor substrate 110 with micro bumps on the interconnect circuit structure 130 may be singulated from the first semiconductor wafer and then picked and placed on the second semiconductor wafer WF in a manner that the micro bumps on the interconnect circuit structure 130 contacting the micro bumps on the interconnect circuit structure 222. The first semiconductor substrate 110 may be joint onto the second semiconductor substrate 210 through a chip-on wafer process. In some embodiments, the pitch of the connectors BM may be 10 μm or less. In some embodiments the first semiconductor substrate 110 and the second semiconductor substrate 220 may be bonded to each other through a hybrid bonding process, such that there is no gap between the interconnect circuit structure 130 on the first semiconductor substrate 110 and the interconnect circuit structure 220 on the second semiconductor substrate 210.

Figure 1B:
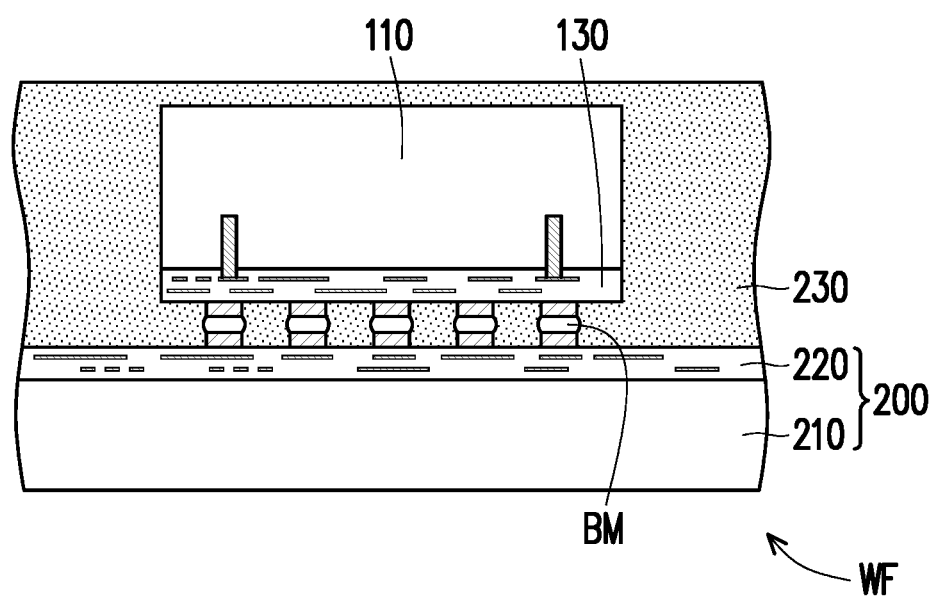

In FIG. 1B, after connecting the singulated first semiconductor substrate 110 onto the second semiconductor substrate 210 in the second semiconductor wafer WF, a first insulating encapsulation 230 is formed over the second semiconductor wafer WF to at least laterally encapsulate the first semiconductor substrate 110 and the interconnect circuit structure 130 formed on the first semiconductor substrate 110. In some embodiments, the first insulating encapsulation 230 may fill the gap between the interconnect circuit structure 130 on the first semiconductor substrate 110 and the interconnect circuit structure 220 on the second semiconductor substrate 210, and the first insulating encapsulation 230 may encapsulate the connectors BM. In some alternative embodiments, an underfill material may further be formed to fill the gap between the interconnect circuit structure 130 on the first semiconductor substrate 110 and the interconnect circuit structure 220 on the second semiconductor substrate 210 to encapsulate the connectors BM. The first insulating encapsulation 230 may encapsulate and/or contact with the unerfill material, the interconnect circuit structure 130 and the first semiconductor substrate 110. In some other embodiments, the first semiconductor substrate 110 and the second semiconductor substrate 210 may be bonded to each other through a hybrid bonding process and there is no gap between the interconnect circuit structure 130 and the interconnect circuit structure 220. In some embodiments, the material of the first insulating encapsulation 230 and the underfill (not shown) includes epoxy polymer or other suitable dielectric materials.

Figure 1C:
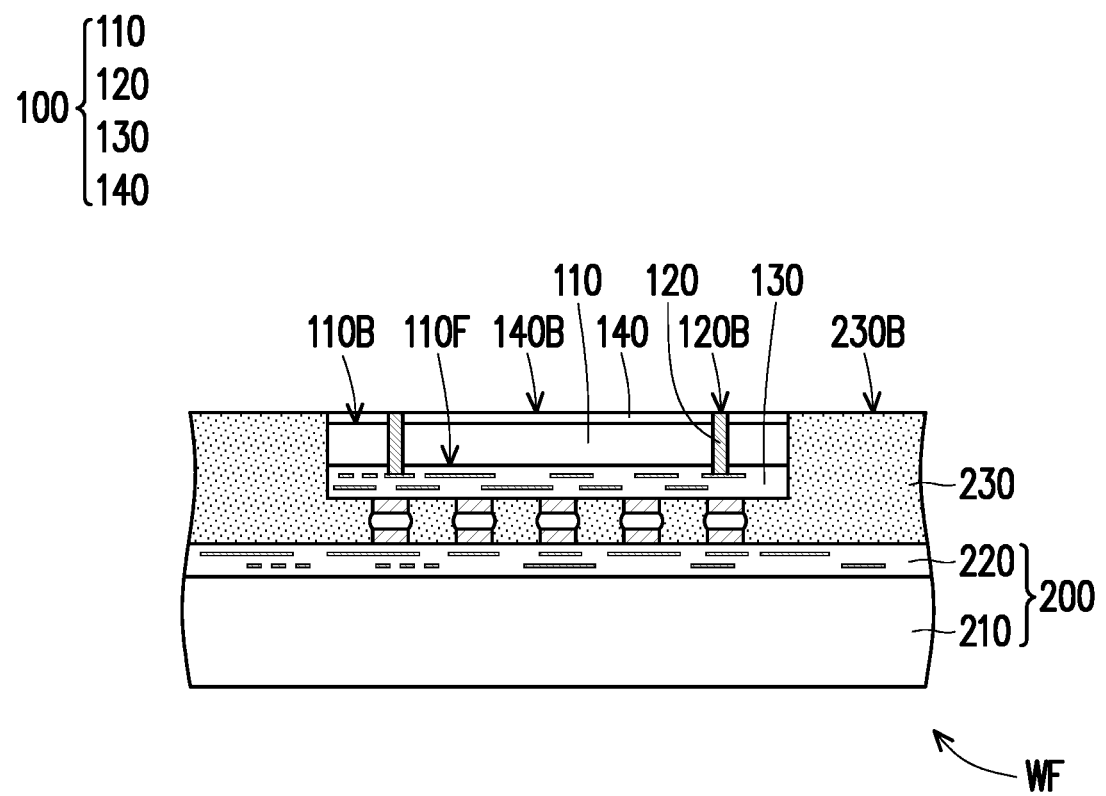

Subsequently, in FIG. 1C, a reveal process is performed to reveal the through silicon via 120 and an isolation layer 140 is formed on the first semiconductor substrate 110 at a back side 110B to form a first semiconductor die 100. In some embodiments, the isolation layer 140 may have a thickness, for example around 2 μm or more, sufficient to isolate the first semiconductor substrate 110 from the material that may be diffused from the overlying layers. To reveal the through silicon via 120, a grinding process may be performed on the structure of FIG. 1B to partially remove the first insulating encapsulation 230 until the first semiconductor substrate 110 is leveled with the first insulating encapsulation 230. The grinding process for partially removing the first insulating encapsulation 230 includes a mechanical grinding process, a CMP process, or combinations thereof. The reveal process may include removing a portion of the first semiconductor substrate 110 using an etching technique, such as wet etching, dry etching or the like, until a portion of the through silicon via 120 is exposed and protruded away from the etched surface the first semiconductor substrate 110 at the back side 110B.

A concave structure is formed by etching the first semiconductor substrate 110 that is already encapsulated by the first insulating encapsulation 230 and the isolation layer 140 is formed in the concave structure defined by the first insulating encapsulation 230 and the etched first semiconductor substrate 110. In some embodiments, the first insulating encapsulation 230 may be covered by a protection material during etching the first semiconductor substrate 110, or alternatively, the etchant using for etching the first semiconductor substrate 110 may have good selection between the material of the first semiconductor substrate 110 and the material of the first insulating encapsulation so that the material of the first semiconductor substrate 110 would least likely spread in the etching chamber, which facilitates to maintain the vacuum state of the etching chamber. In some embodiments, the protection material covering the first insulating encapsulation 230 during etching the first semiconductor substrate 110 may be later removed to expose the first insulating encapsulation 230.

In some embodiments, the isolation layer 140 is made of low temperature polyimide that may be curable at a temperature lower than 250° C. but is not limited thereto. The isolation layer 140 may be formed before removing the protection material used in the etching process or after removing the protection material. The material of the protection material may be the same as the material of the isolation layer 140, e.g. low temperature polyimide, but is not limited thereto. A grinding process may be performed to remove a portion of the material of the isolation layer 140 on the first insulating encapsulation 230 to form the first semiconductor die 100. In FIG. 1C, a terminal 120B of the through silicon via 120, a top surface 230B of the first insulating encapsulation 230 and a top surface 140B of the isolation layer 140 are coplanar and leveled with one another.

The first semiconductor die 100 may include the first semiconductor substrate 110, the through silicon via 120 extending through the first semiconductor substrate 110 from the front side 110F to the back side 110B opposite to the front side 110F, the interconnect circuit structure 130 formed at the front side 110F, and the isolation layer 140 covering the first semiconductor substrate 110 at the back side 110B. The first semiconductor die 100 is bonded to the second semiconductor substrate 210 that is a portion of the second semiconductor wafer WF. The first semiconductor die 100 is laterally encapsulated by the first insulating encapsulation 230 and is coplanar with the first insulating encapsulation 230. The side edge of the first semiconductor substrate 110, the side edge of the interconnect circuit structure 130 and the side edge of the isolation layer 140 may be aligned with one another and in direct contact with the first insulating encapsulation 230.

Figure 1D:
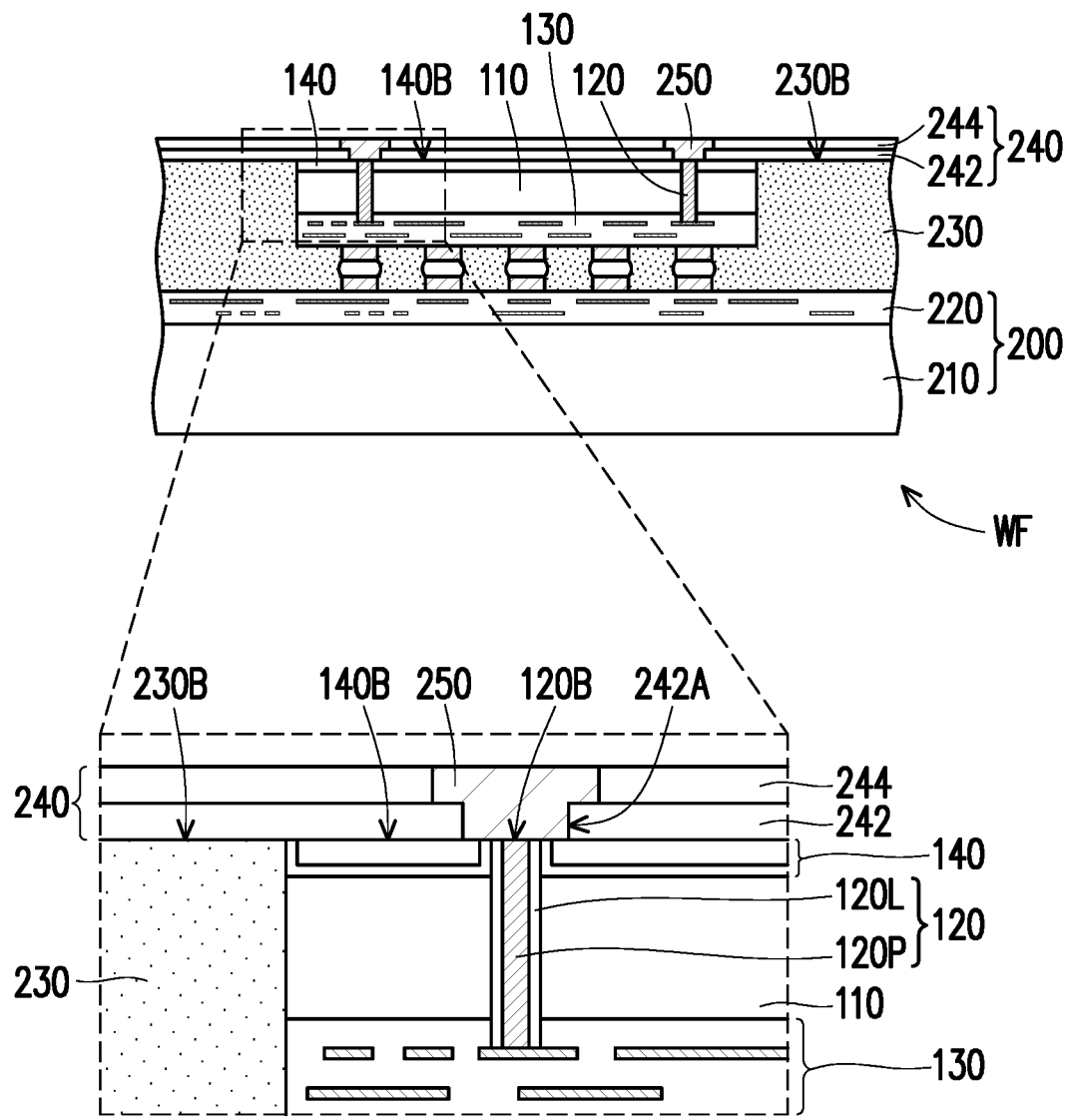

In FIG. 1D, a dielectric layer 242 is formed on the first insulating encapsulation 230 and the first semiconductor die 100. The dielectric layer 242 covers the top surface 230B of the first insulating encapsulation 230 and the top surface 140B of the isolation layer 140 and having an opening 242A so that the terminal 120B of the through silicon via 120 is not covered by the dielectric layer 242. A conductor structure 250 is formed and fills the opening 242A of the dielectric layer 242 so as to contact the terminal 120B of the through silicon via 120, such that the through silicon via 120 is electrically connected to both the conductor structure 250 and conductive wires of the interconnect circuit structure 130. The conductor structure 250 may be a cupper via, a liner cupper via, or the like. In addition, another dielectric layer 244 may be further formed on the dielectric layer 242 and encircle the conductor structure 250 so that the dielectric layer 242 and the dielectric layer 244 form a dielectric layer structure 240. The dielectric layer structure 240 covers the first semiconductor die 100 and the first insulating encapsulation 230. The conductor structure 250 extends through the dielectric layer structure 240 and electrically connected to the through silicon via 120. Some of the conductor structure 250 may be used as a test pad for a wafer-level testing such that tested and reliable known good dies (KGDs) may be recognized.

As shown in the enlarged portion in FIG. 1D, the through silicon via 120 may include a metal pillar 120P and a liner 120L that encircles the metal pillar 120P while the liner 120L is omitted in other drawings for illustration purpose. The liner 120L may isolate the metal pillar 120P from the first semiconductor substrate 110 to prohibit the spread of the metal material of the metal pillar 120P to the first semiconductor substrate 110. In some embodiments, the formation of the through silicon via 120 includes forming TSV opening in the first semiconductor substrate 110, forming the liner 120L in the TSV opening, and filling metallic materials into the remaining portion of the TSV opening to form the metal pillar 120P that is encircled by the liner 120L. The through silicon via 120 often has a high aspect ratio, for example, greater than about 7, but is not limited thereto.

Figure 1E:
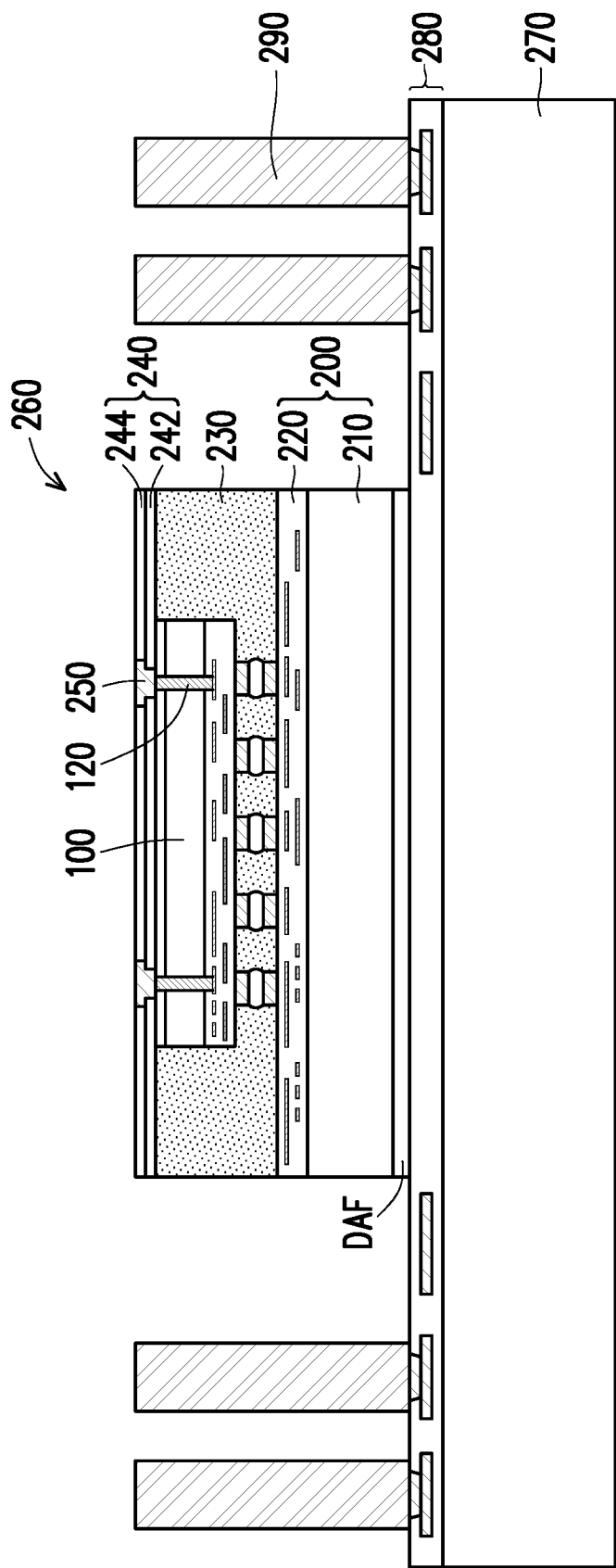

Subsequent to the formation of the conductor structure 250, the second semiconductor wafer WF is thinned and sawed. FIG. 1E shows that a second semiconductor die 200 singulated from the second semiconductor wafer WF includes the second semiconductor substrate 210 and the interconnect circuit structure 220 and is stacked with the first semiconductor die 100 having the through silicon via 120. A stack structure 260 of the first semiconductor die 100 and the second semiconductor die 200 with the conductor structure 250 and the dielectric layer structure 240 formed on the first semiconductor die 100 is picked and placed on a carrier 270. Specifically, a back side fan-out redistribution circuit structure 280 and a through insulation via 290 electrically connected to the back side fan-out redistribution circuit structure 280 are formed on the carrier 270 in advance and the stack structure 260 of the first semiconductor die 100 and the second semiconductor die 200 is attached onto the back side fan-out redistribution circuit structure 280 with the conductor structure 250 facing up.

In some embodiments, the stack of the first semiconductor die 100 and the second semiconductor die 200 is attached to the back side fan-out redistribution circuit structure 280 by using a die attach film DAF. In the stack structure 260 of the first semiconductor die 100 and the second semiconductor die 200, the lateral dimension of the first semiconductor die 100 is smaller than the lateral dimension of the second semiconductor die 200 and the first semiconductor die 100 is encapsulated by the first insulating encapsulation 230 over the second semiconductor die 200. The side edge of the first insulating encapsulation 230 may be aligned with the side edge of the second semiconductor die 200 as well as the side edge of the dielectric layer structure 240.

Figure 1F:
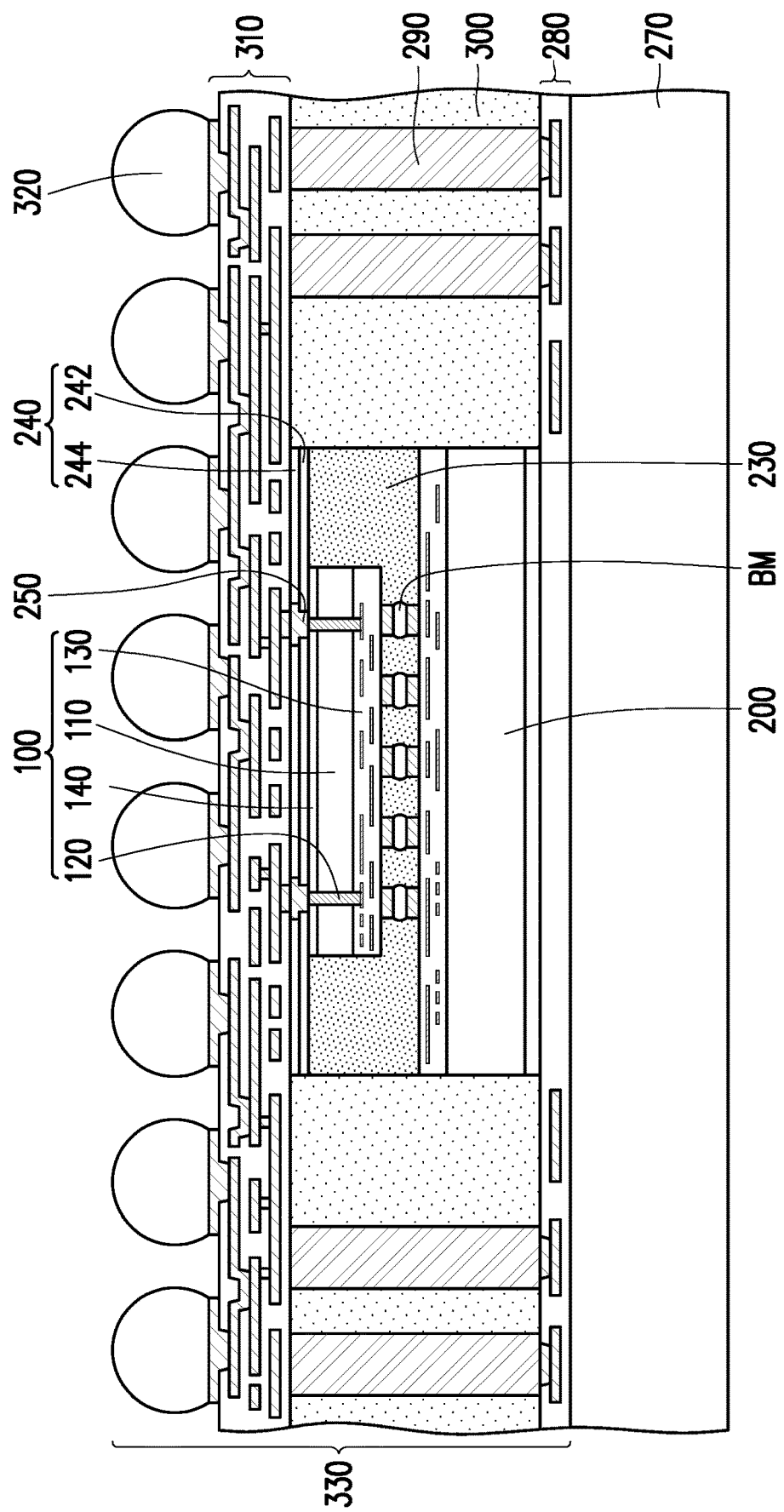

In FIG. 1F, a second insulating encapsulation 300 is formed on the carrier 270 to laterally encapsulate the stack structure 260 of the first semiconductor die 100 and the second semiconductor die 200. The second insulating encapsulation 300 may by in contact with a side edge of the second semiconductor die 200, a side edge of the first insulting encapsulation 230, and a side edge of the dielectric layer structure 240. A front side fan-out redistribution circuit structure 310 is further formed on the stack structure 260 and the second insulating encapsulation 300. The front side fan-out redistribution circuit structure 310 may be electrically connected to the conductor structure 250 and the through insulation via 290. In addition, a bonding structure 320 may be further formed on the front side fan-out redistribution circuit structure 310 to bond to an external component such as a circuit board or the like. The bonding structure 320 may include under bump metals and solder balls on the under bump metals, or the like.

Prior to forming the front side fan-out redistribution circuit structure 310, a planarization process such as chemical grinding, mechanical grinding, CMP, or the like may be performed so that the surface of the second insulating encapsulation 300, the surface of the dielectric layer structure 240, the terminal of the through insulation via 290 and the surface of the conductor structure 250 may be leveled with and coplanar to one another. The front side fan-out redistribution circuit structure 310 may be electrically connected to the conductor structure 250 and the through insulation via 290 so that the first semiconductor die 100, the second semiconductor die 200, the back side fan-out redistribution circuit structure 280, and the front side fan-out redistribution circuit structure 310 may mutually electrically connected to accomplish the required circuit function.

In FIG. 1F, a semiconductor package 330 is formed on the carrier 270. The semiconductor package 330 includes the first semiconductor die 100, the second semiconductor die 200, the first insulating encapsulation 230, the dielectric layer structure 240, the conductor structure 250, the through insulation via 290, the second insulating encapsulation 300, the back side fan-out redistribution circuit structure 280, the front side fan-out redistribution circuit structure 310 and the bonding structure 320. The first semiconductor die 100 is bonded to the second semiconductor die 200 in a manner that the front (active) side of the first semiconductor die 100 facing the front (active) side of the second semiconductor die 200 through the connectors BM. The first insulating encapsulation 230 is disposed on the second semiconductor die 200 and laterally encapsulates the first semiconductor die 110. The dielectric layers 242 and 244 of the dielectric layer structure 240 are disposed on the first semiconductor die 100 and the first insulating encapsulation 230 and continuously cover the first semiconductor die 100 and the first insulating encapsulation 230. The dielectric layer 242 may be in direct contact with the first semiconductor die 100 and the first insulating encapsulation 230. The back side fan-out redistribution circuit structure 280 is disposed on the back side of the second semiconductor die 200 and exceeds the second semiconductor die 200. The second insulating encapsulation 300 laterally encapsulates the first insulating encapsulation 230 and the second semiconductor die 200, and the back side fan-out redistribution circuit structure 280 is in direct contact with the second insulating encapsulation 300. The front side fan-out redistribution circuit structure 310 is disposed on and in contact with the second insulating encapsulation 300 and the dielectric layer structure 240. The through insulation via 290 extends through the second insulating encapsulation 300 and connected between the back side fan-out redistribution circuit structure 280 and the front side fan-out redistribution circuit structure 310. The bonding structure 320 is disposed on the front side fan-out redistribution circuit structure 310.

The first semiconductor die 100 has the first semiconductor substrate 110, the through silicon via 120 extending through the first semiconductor substrate 110, the interconnect circuit structure 130 disposed at the front side of the first semiconductor substrate 110, and the isolation layer 140 disposed at the back side of the first semiconductor substrate 110. The isolation layer 140 is interposed between the first semiconductor substrate 110 and the dielectric layer structure 240. The terminal of the through silicon via 120 is coplanar with a surface of the first insulating encapsulation 230 and also is coplanar with a surface of the isolation layer 140. The isolation layer 140 is made of low temperature polyimide and may prevent the metal material such as Cu in the front side fan-out redistribution circuit structure 310 from diffusing to the first semiconductor substrate 110 of the first semiconductor die 100. The isolation layer 140, the through silicon via 120 and the first insulating encapsulation 230 are coplanar.

Figure 1G:
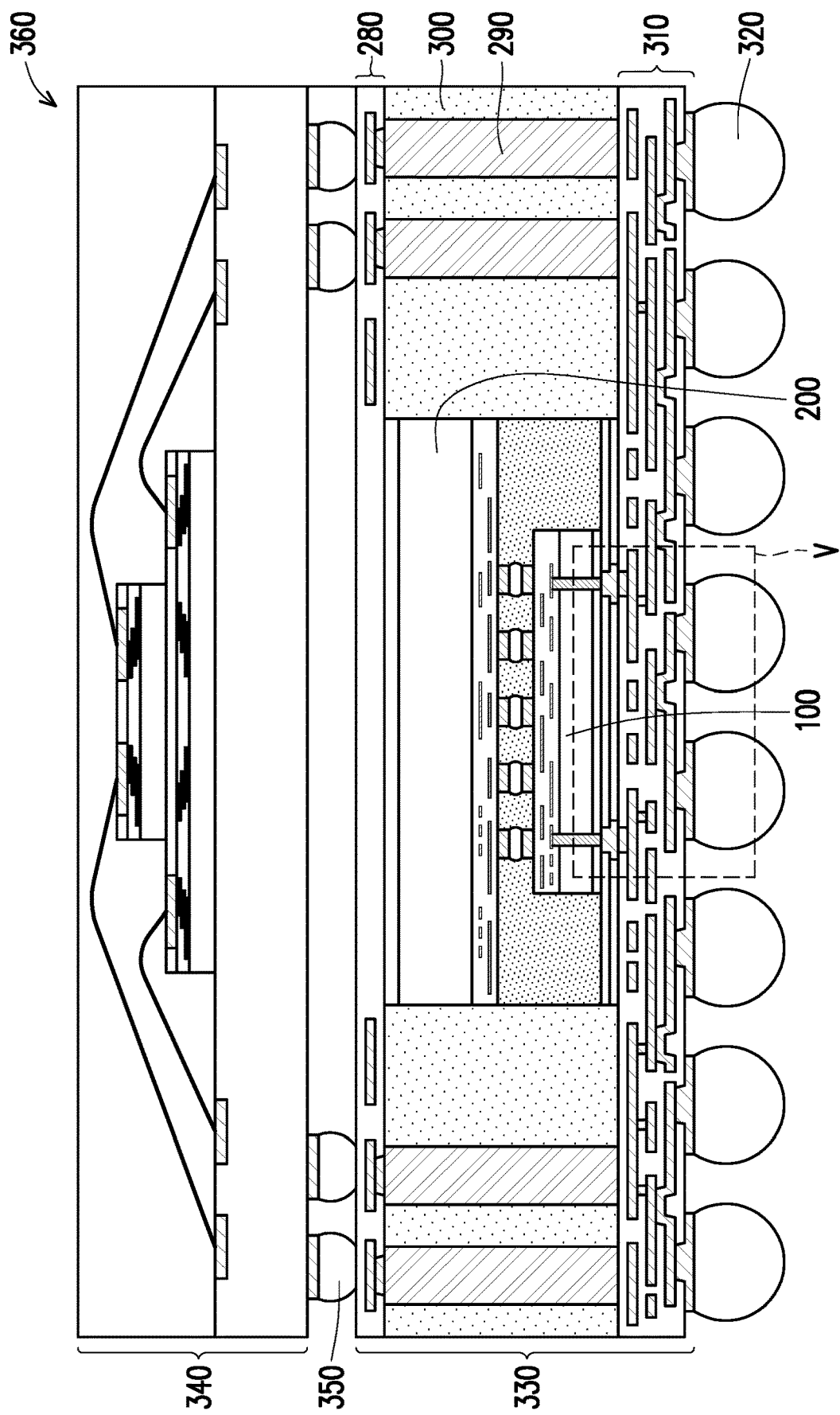

In FIG. 1G, the carrier 270 is removed, and a singulation process may be performed to singulate the semiconductor package 330. The semiconductor package 330 is oriented upside down and another semiconductor package 340 is bonded to the semiconductor package 330 through a bonding structure 350 to form a package-on-package (PoP) structure 360. In some embodiments, the semiconductor package 340 may be a memory, such as DRAM package and the bonding structure 350 may include solder balls. The bonding structure 350 may be disposed between the back side fan-out redistribution circuit structure 280 of the semiconductor package 330 and the bonding pads on the semiconductor package 340. The semiconductor package 340 may further be electrically connected to the front side fan-out redistribution circuit structure 310 through the through insulation via 290.

Figure 2A:
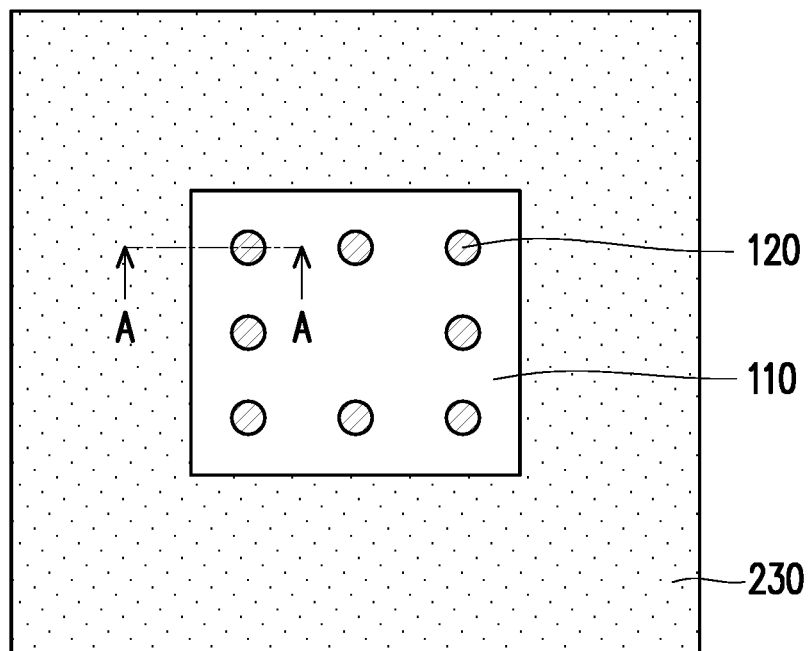
FIG. 2A through FIG. 2I are schematically illustrating a process flow of the step shown in FIG. 1C in accordance with some embodiments of the disclosure.
Figure 2B:
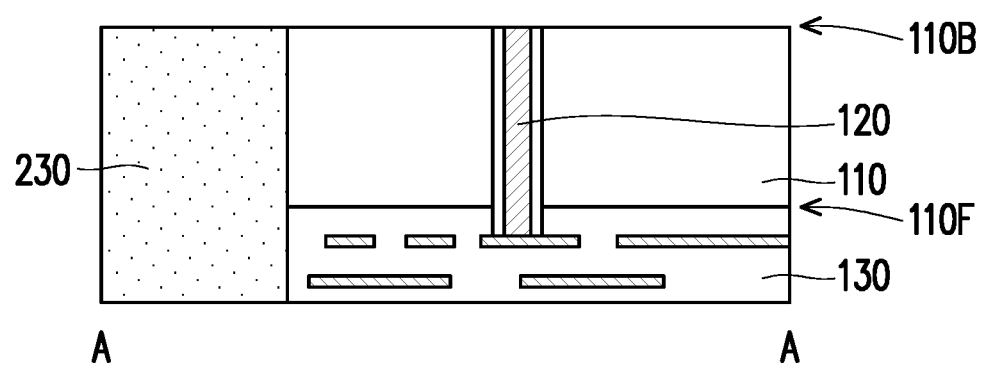

FIG. 2A schematically shows the first semiconductor substrate 110 laterally encapsulated by the second insulating encapsulation 230 in the top view direction and FIG. 2B schematically illustrate a cross section taken along line A-A in FIG. 2A. In FIGS. 2A and 2B, the interconnect circuit structure 130 is disposed at the front side 110F of the first semiconductor substrate 110. The first insulating encapsulation 230 is in contact with the side edge of the first semiconductor substrate 110 and the side edge of the interconnect circuit structure 130. The terminal of the through silicon via 120 is exposed at the back side 110B of the first semiconductor substrate 110. In some embodiments, the structures shown in FIGS. 2A and 2B may be formed by performing a planarization process, such as a chemical grinding, a mechanical grinding or the like on the structure shown in FIG. 1B until the terminal of the through silicon via 120 is exposed. The surface of the first insulating encapsulation 230, the surface of the first semiconductor substrate 110 and the terminal of the through silicon via 120 are coplanar after the grinding process. The first insulating encapsulation 230 forms a ring shape encircling the first semiconductor substrate 110 in the top view.

Figure 2C:
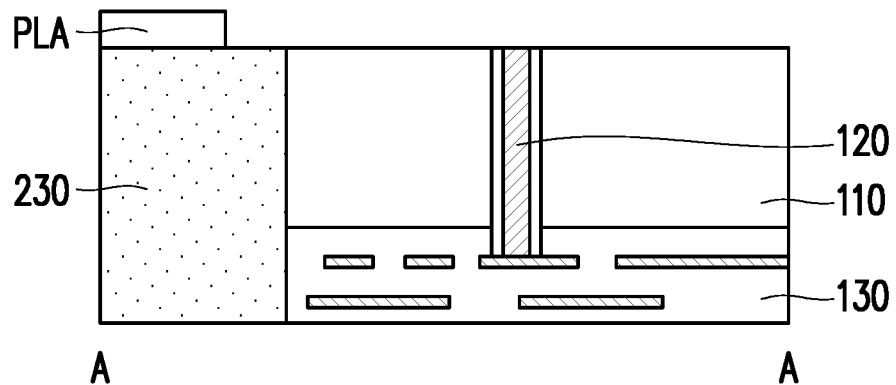

FIG. 2C shows a protection layer PLA formed on the structure of FIG. 2B to cover at least a portion of the first insulating encapsulation 230. The protection layer PLA may expose the terminal of the through silicon via 120. The formation of the protection layer PLA may include coating a protection material such as low temperature polyimide on the first insulating encapsulation 230 and the first semiconductor substrate 110 and subsequently pattern the protection material by a lithographic process to expose the first semiconductor substrate 110 and the through silicon via 120. The patterned protection material may further be cured to form the protection layer PL.

In FIG. 2C, the protection layer PLA may completely expose the first semiconductor substrate 110. The protection layer PLA covers most of the surface of the first insulating encapsulation 230. A portion of the first insulating encapsulation 230 proximate to the first semiconductor substrate 110 may not be covered by the protection layer PLA and may have a small width of smaller than 100 nm. In alternative embodiments, the protection layer PLA may completely cover the first insulating encapsulation 230, such that the side edge of the protection layer PLA may be aligned with the boundary between the first insulating encapsulation 230 and the first semiconductor substrate 110.

Figure 2D:
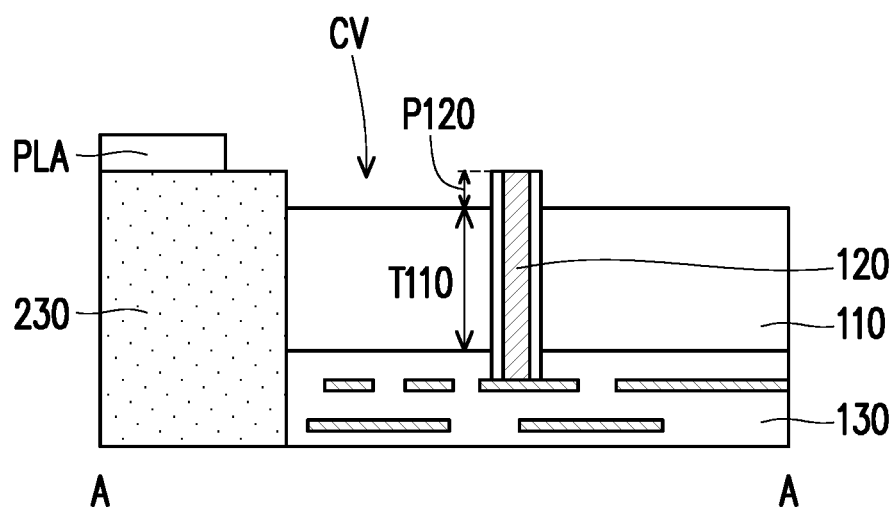

In FIG. 2D, an etching process is performed to remove a portion of the first semiconductor substrate 110, such that a concave structure CV defined by the first insulating encapsulation 230 and the etched first semiconductor substrate 110 is formed. The etching process may include a wet etching technique, a dry etching technique, or a combination thereof. In some embodiments, the etching process may be performed in an etching chamber. The protection layer PLA covers the first insulating encapsulation 230 so that the first insulating encapsulation 230 may least likely be reacted with the etchant for removing the material of the first semiconductor substrate 110. Thereby, the contamination of the material of the first insulating encapsulation 230 in the etching chamber may be prevented. In some embodiments, the etched first semiconductor substrate 110 may have a thickness T110 of around 5 μm~25 μm, for example. The through silicon via 120 may extend away from the surface of the first semiconductor substrate 110 in the concave structure CV and has a protruding height P120 of around 0.2 μm~2 μm above the surface of the first semiconductor substrate 110.

Figure 2E:
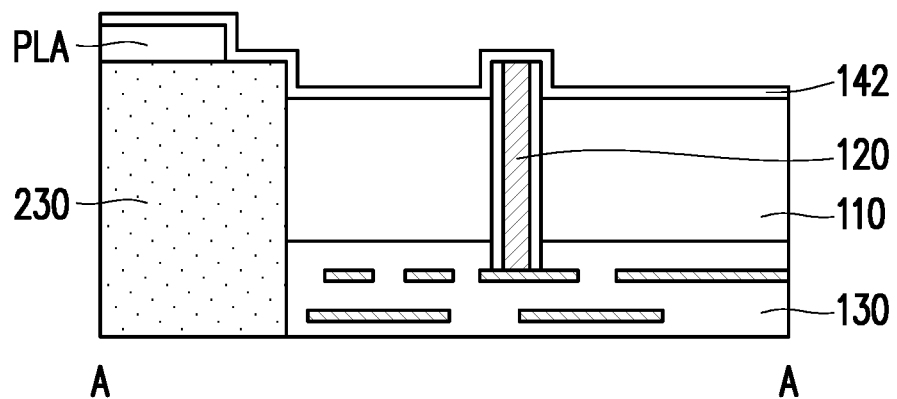

In FIG. 2E, a first isolation layer 142 is formed on the structure of FIG. 2D through, for example, a deposition process. The material of the first isolation layer 142 may include nitride, oxide, or the like. In some embodiments, the first isolation layer 142 may be made of low temperature silicon nitride and may have a thickness of 11 kÅ, but the disclosure is not limited thereto. The first isolation layer 142 conformally covers the protection layer PL, the first semiconductor substrate 110, and the protruding portion of the through silicon via 120 as well as the portion of the first insulating encapsulation 230 that is not covered by the protection layer PL.

Figure 2F:
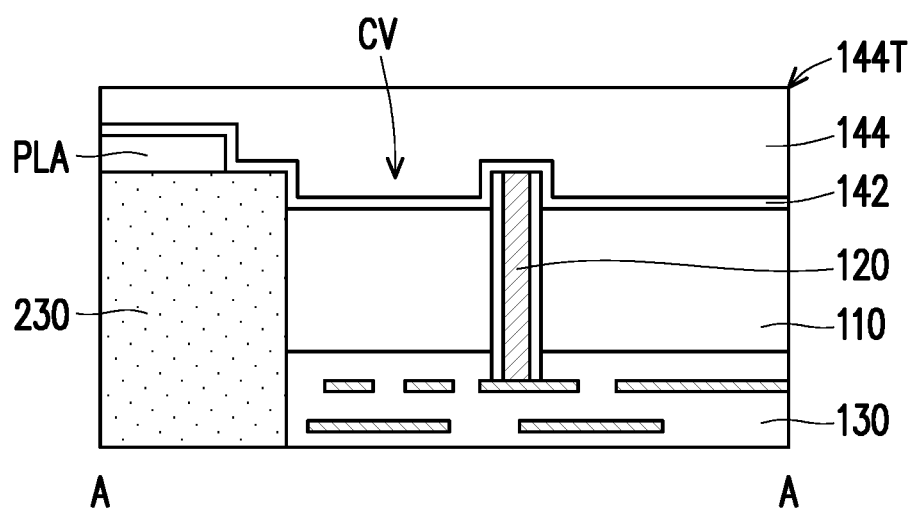

In FIG. 2F, a second isolation layer 144 is further formed on the first isolation layer 142 by coating an isolation material on the first isolation layer 142. A material of second isolation layer 144 may be different from the material of the first isolation layer 144, for example. In some embodiments, the material of the second isolation layer 144 may be the same as the material of the protection layer PL. For example, the material of the second isolation layer 144 may be low temperature polyimide. The second isolation layer 144 may have sufficient thickness to compensate the underlying staggered structure and provide a planar top surface 144T. The second isolation layer 144 fills the concave structure CV formed by the etching process of FIG. 2D and covers the protection layer PLA over the first insulating encapsulation 230.

Figure 2G:
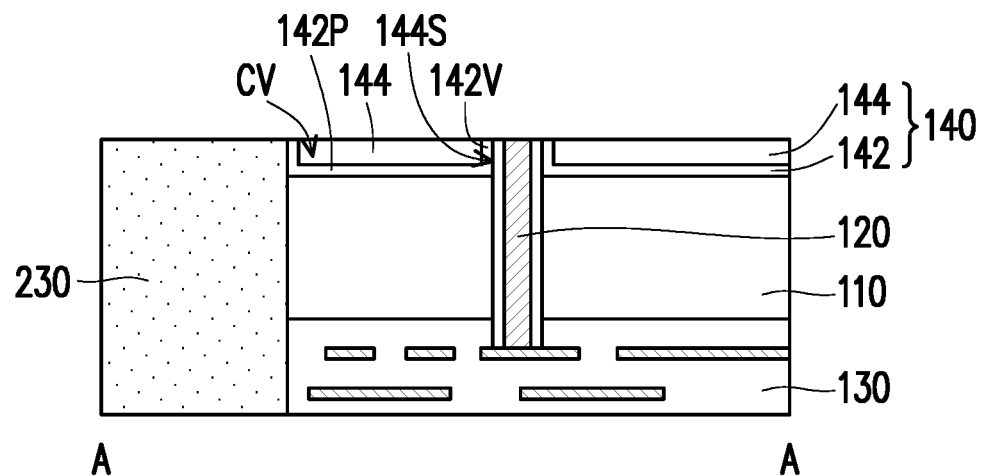

A grinding process such as chemical grinding, mechanical grinding or a combination thereof, is performed on the structure of FIG. 2F until completely removing the protection layer PLA. As shown in FIG. 2G, a surface of the first insulating encapsulation 230, a portion of the first isolation layer 142, a surface of the second isolation layer 144 and a terminal of the through silicon via 120 are revealed after the grinding process. The first isolation layer 142 has a U-shape cross section. The first isolation layer 142 includes a planar portion 142P and a vertical portion 142V. The planar portion 142P is between the second isolation layer 144 and the first semiconductor substrate 110. The vertical portion 142V vertically extending from the periphery of the planar portion 142 toward a level of the terminal of the through silicon via 120 to encircle a side edge 144S of the second isolation layer 144. A portion of the vertical portion 142V of the first isolation layer 142 is between the first insulating encapsulation 230 and the second isolation layer 144 and in contact with the first insulating encapsulation 230. The first isolation layer 142 and the second isolation layer 144 may construct the isolation layer 140 in the structure as shown in FIG. 1C. In other words, the structure of FIG. 2G may serve as an embodiment of the structure of FIG. 1C. In some embodiments, the isolation layer 140 including the first isolation layer 142 and the second isolation layer 144 may have a thickness of 1 μm~3 μm. In some embodiments, the first isolation layer 142 may be omitted so that the isolation layer 140 is a single layer filling the concave structure CV defined by the first insulating encapsulation 230 and the first semiconductor substrate 110 and in direct contact with the side edge of the through silicon via 120 and the first insulating encapsulation 230.

Figure 2H:
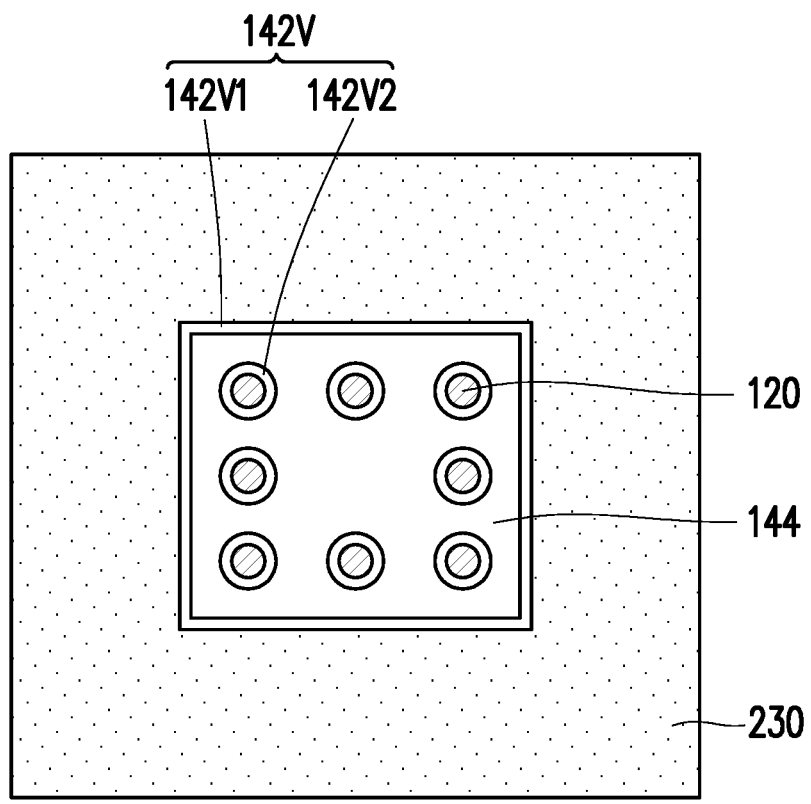

FIG. 2H schematically illustrates a top surface of a semiconductor package after the step of FIG. 2G. Referring to FIG. 2G and FIG. 2H, the first insulating encapsulation 230 surrounds the first semiconductor substrate 110 and also the first isolation layer 142. The vertical portion 142V may include a first sub portion 142V1 that surrounds the second isolation layer 144 in the top view and a second sub portion 142V2 that surrounds the through silicon via 120 in the top view. The first sub portion 142V1 has a ring-like structure and is interposed between the second isolation layer 144 and the first insulating encapsulation 230. The second sub portion 142V2 has a ring-like structure and is interposed between the second isolation layer 144 and the through silicon via 120.

Figure 2I:
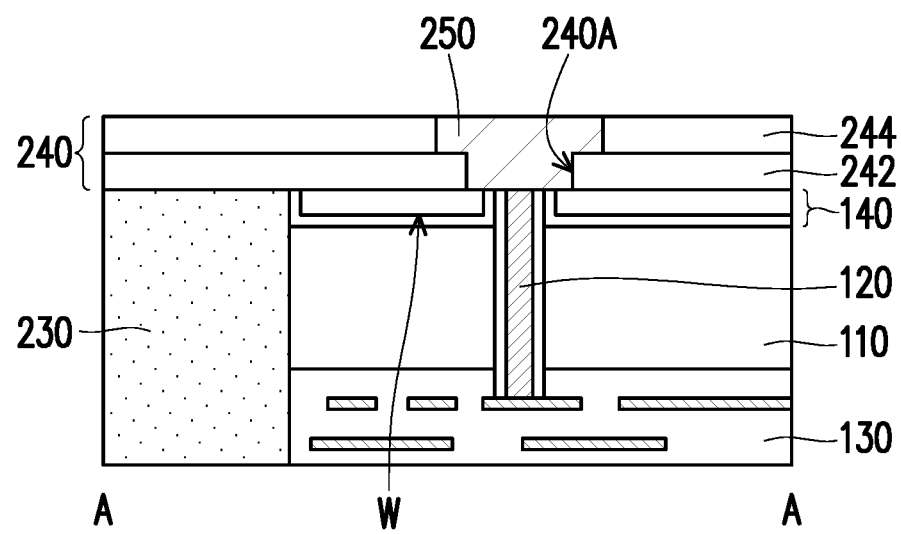

In FIG. 2I, the dielectric layer 242 is formed on the structure of FIG. 2G. The material of the dielectric layer 242 may be the same as the material of the second isolation layer 144 of the isolation layer 140. For example, the dielectric layer 242 may be made of low temperature polyimide. The dielectric layer 242 has the opening 242A so that the dielectric layer 242 does not cover the terminal of the through silicon via 120. The dielectric layer 242 is formed on the planar surface that is constructed by the coplanar configuration of the first insulating encapsulation 230, the isolation layer 140 and the through silicon via 120.

In FIG. 2I, the conductor structure 250 is further formed on the dielectric layer 242 and fills the opening 242A of the dielectric layer 242 and another dielectric layer 244 is formed on the dielectric layer 242 to encircle the conductor structure 250 so as to form the dielectric layer structure 240 as shown in FIG. 1D. The conductor structure 250 may be formed by metal such as copper to serve as a conductive via. In some embodiments, the conductor structure 250 may be a linear via.

Figure 3A:
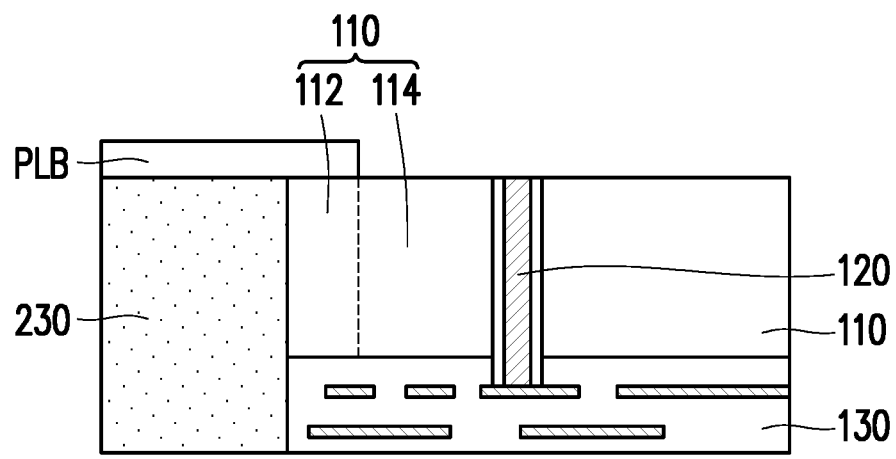
FIG. 3A through FIG. 3G are schematically illustrating a process flow of the step shown in FIG. 1C in accordance with some embodiments of the disclosure.

FIG. 3A schematically illustrate an alternative structure of FIG. 2C. In FIG. 3A, a protection layer PLB is formed on the structure of FIG. 2B to completely cover the first insulating encapsulation 230 and further cover a peripheral portion 112 of the first semiconductor substrate 110. The peripheral portion 112 of the first semiconductor substrate 110 is proximate to and in contact with the first insulating encapsulation 230. The protection layer PLB does not cover the through silicon via 120. The material of the protection layer PLB may include low temperature polyimide. In some embodiments, the material of the protection layer PLB may be other material that can serve as mask in the following process. For example, the material of the protection layer PLB may be photoresist.

Figure 3B:
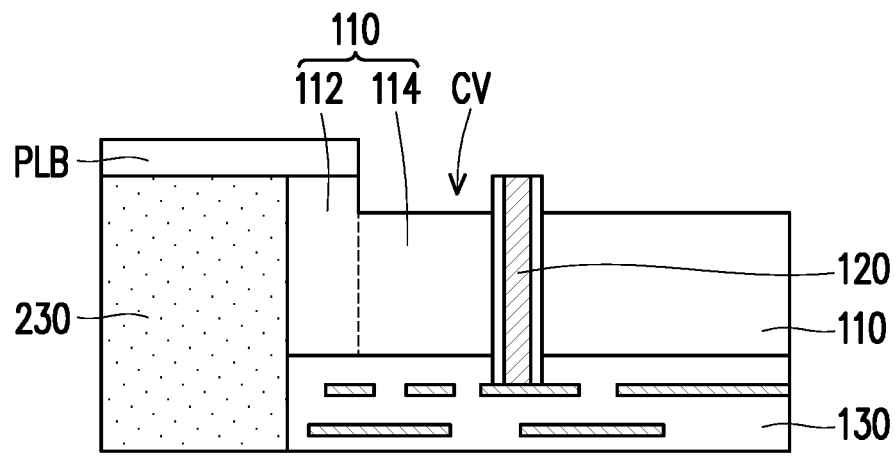

In FIG. 3B, an etching process using the protection layer PLB as mask is performed to remove a portion of the first semiconductor substrate 110 that is not covered by the protection layer PLB. The etched semiconductor substrate 110 includes the peripheral portion 112 and a thinned portion 114 that is surrounded by the peripheral portion 112. The peripheral portion 112 is in direct contact with the insulating encapsulation 230 and is positioned between the first insulating encapsulation 230 and the thinned portion 114. A thickness of the peripheral portion 112 is greater than the thinned portion 114 so as to form a concave structure CV. The through silicon via 120 is disposed in the thinner portion 114 and a portion of the through silicon via 120 is protruded from the surface of the thinned portion 114. In the etching process, the first insulating encapsulation 230 is completely covered and thus the first insulating encapsulation 230 is not subject to the etchant used in the etching process. A contamination of the material of the first insulating encapsulation 230 to the etching chamber may be prevented.

Figure 3C:
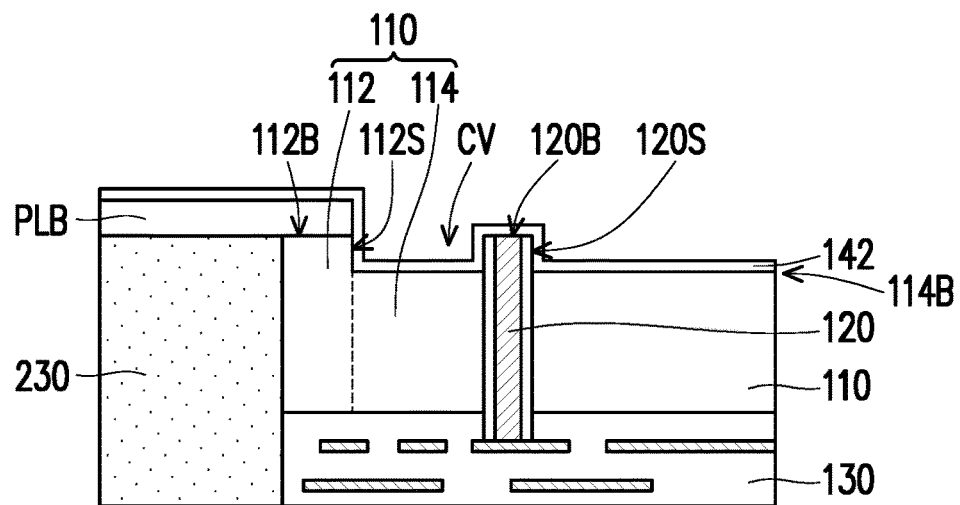

In FIG. 3C, a first isolation layer 142 is formed on the structure of FIG. 3B to cover the thinner portion 114 of the first semiconductor substrate 110, the through silicon via 120, and the protection layer PLB. The first isolation layer 142 may conformally cover the top surface and the side edge of the protection layer PLB, the top surface 114B of the thinned portion 114, the side edge 120S of the revealed portion of the through silicon via 120, and the terminal 120B of the through silicon via 120. In addition, the side edge 112S of the peripheral portion 112 of the first semiconductor substrate 110 is also covered by the first isolation layer 142 while the top surface 112B of the peripheral portion 112 is covered by the protection layer PLB. The first isolation layer 142 may be made of oxide, nitride or a combination thereof and may be formed on the first semiconductor substrate 110 through a deposition process. In some embodiments, the material of the first isolation layer 142 may be low temperature silicon nitride.

Figure 3D:
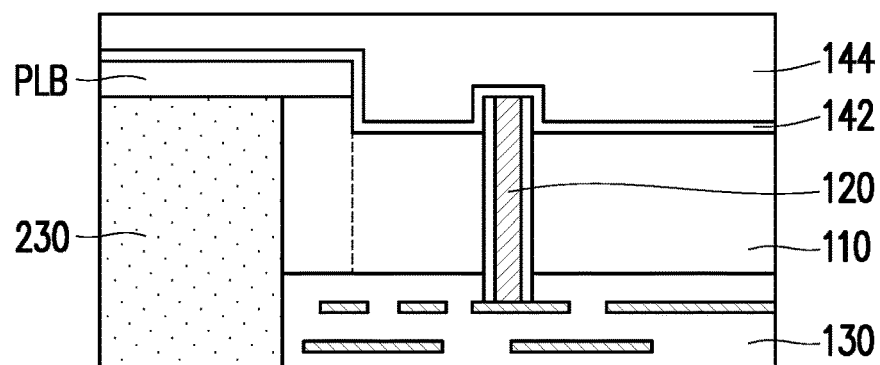

In FIG. 3D, a second isolation layer 144 is formed on the first isolation layer 142. In some embodiments, the second isolation layer 144 is formed by a coating process and the second isolation layer 144 has a sufficient thickness to compensate the uneven structure caused by the protection layer PLB, the etched first semiconductor substrate 110 and the revealed through silicon via 120. The second isolation layer 144 may be made of low temperature polyimide. In some embodiments, the first isolation layer 142 may be omitted so that the second isolation layer 144 may be in contact with the first semiconductor substrate 110 and the through silicon via 120.

Figure 3E:
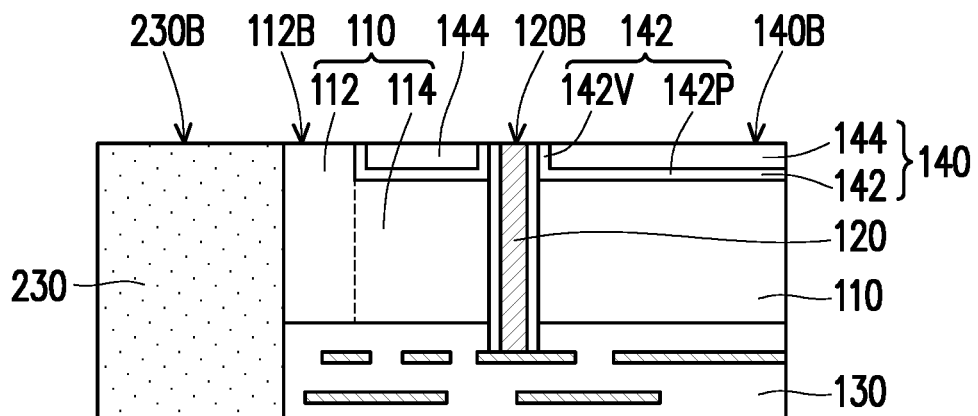

In FIG. 3E, a grinding process is performed to reduce the thickness of the second isolation layer 144 until completely removing the protection layer PLB and revealing the through silicon via 120 and the first insulating encapsulation 230 so as to form the isolation layer 140. The terminal 120B of the through silicon via 120, the top surface 112B of the peripheral portion 112, the top surface 140B of the isolation layer 140, and the top surface 230B of the first insulating encapsulation 230 are coplanar. The structure shown in FIG. 3E may serve as another embodiment of the structure of FIG. 1C.

The isolation layer 140 in the embodiment may include the first isolation layer 142 having U-shaped cross section and the second isolation layer 144 filling the U-shaped cross section of the first isolation layer 142. The first isolation layer 142 includes a planar portion 142P and a vertical portion 142V. The planar portion 142P is disposed between the first semiconductor substrate 110 and the bottom of the second isolation layer 144 and the vertical portion 142V vertically extends from the periphery of the planar portion 142P and is interposed between the through silicon via 120 and the second isolation layer 144 and also between the second isolation layer 144 and the peripheral portion 112 of the first semiconductor substrate 110.

Figure 3F:
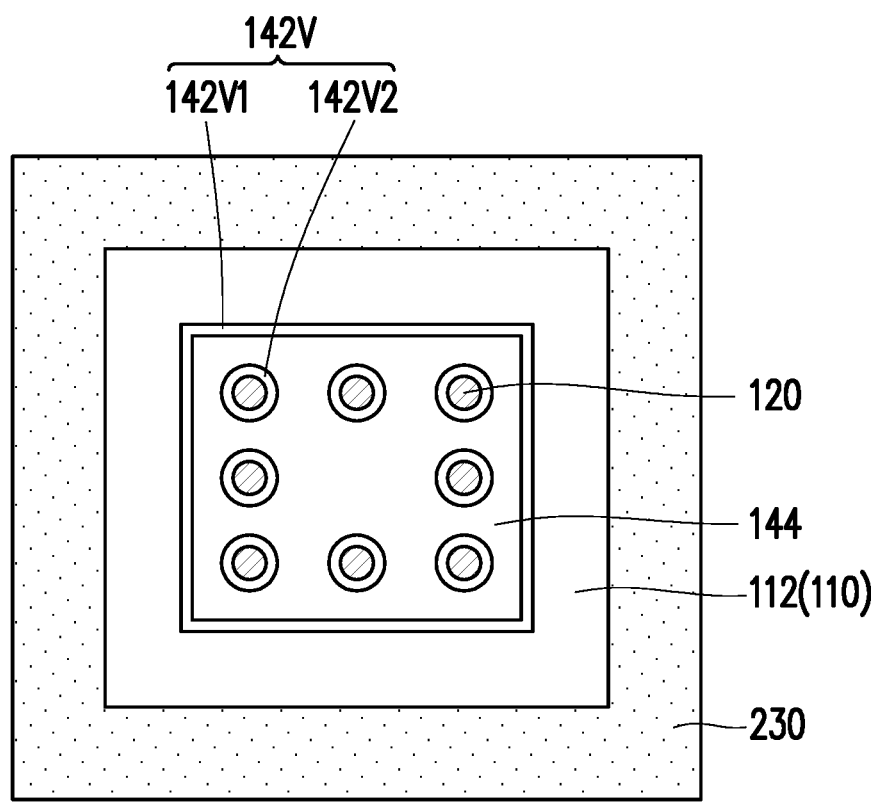

FIG. 3F schematically illustrates a top view of a package after the step of FIG. 3E. In FIG. 3E and FIG. 3F, the first insulating encapsulation 230 surrounds the peripheral portion 112 of the first semiconductor substrate 110 and the first isolation layer 142 is spaced from the first insulating encapsulation 230 by the peripheral portion 112 of the first semiconductor substrate 110. The vertical portion 142V may include a first sub portion 142V1 that surrounds the second isolation layer 144 in the top view and a second sub portion 142V2 that surrounds the through silicon via 120 in the top view. The first sub portion 142V1 has a ring-like structure and is interposed between the peripheral portion 112 of the first semiconductor substrate 110 and the second isolation layer 144. The second sub portion 142V2 has a ring-like structure and is interposed between the second isolation layer 144 and the through silicon via 120.

Figure 3G:
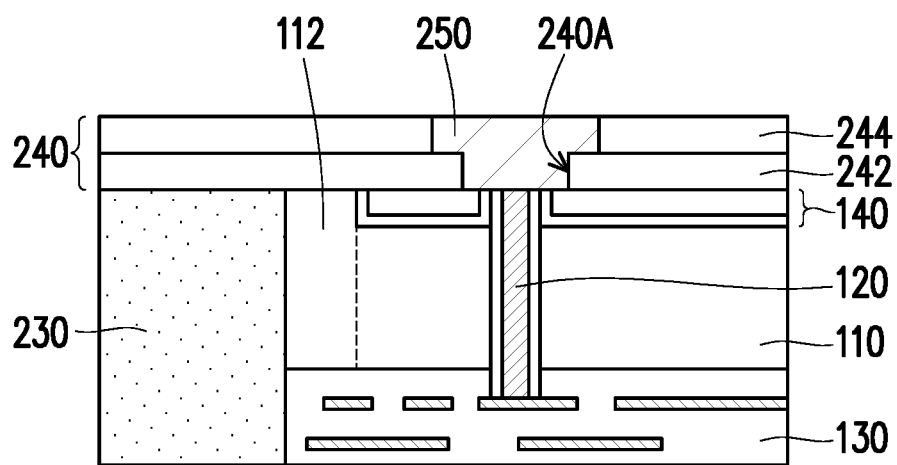

In FIG. 3G, a dielectric layer 242 is formed on the structure of FIG. 3E. The dielectric layer 242 may be made of the material the same as the second isolation layer 144. For example, the material of the dielectric layer 242 may be low temperature polyimide. The dielectric layer 242 may have an opening 242A exposing the through silicon via 120. The dielectric layer 242 may be in direct contact with a portion of the isolation layer 140, the peripheral portion 112 of the first semiconductor substrate 110, and the first insulating encapsulation 230.

In FIG. 3G, a conductor structure 250 and another dielectric layer 244 may be formed on the dielectric layer 242 in sequence. The conductor structure 250 fills the opening 242A of the dielectric layer 242 so as to contact the through silicon via 120. The conductor structure 250 may be a copper via, a copper linear via, or the like. The dielectric layer 244 encircles the conductor structure 250. In some embodiments, the conductor structure 250 may be coplanar with the dielectric layer 244. The structure of FIG. 3G having the thicker peripheral portion 112 in contact with the dielectric layer 242 may serve as an embodiment of the structure of FIG. 1D.

Figure 4A:
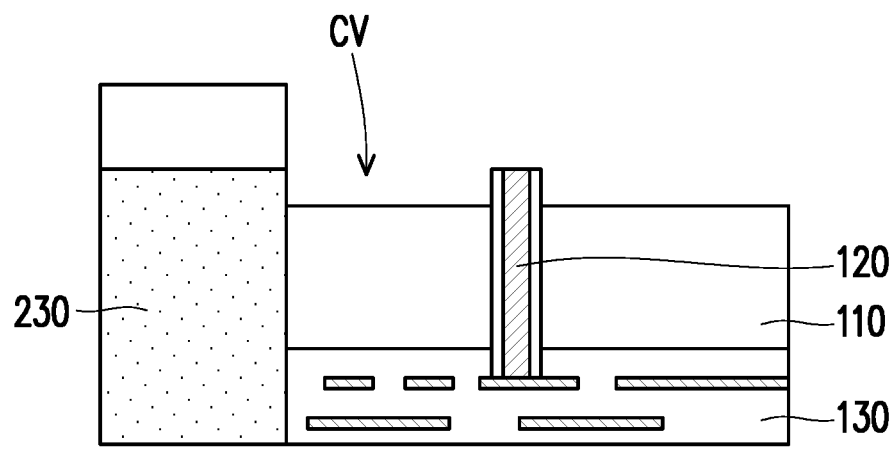
FIG. 4A through FIG. 4E are schematically illustrating a process flow of the step shown in FIG. 1C in accordance with some embodiments of the disclosure.

FIG. 4A schematically illustrates the step of etching the first semiconductor substrate. In FIG. 4A, a protection layer PLC is formed on the first insulating encapsulation 230 and substantially completely covers the first insulating encapsulation 230. The etching process is performed to remove a portion of the first semiconductor substrate 110 to reveal a portion of the through silicon via 120. The step of FIG. 4A is similar to the step of FIG. 2D and the step of FIG. 3B so that a concave structure CV is formed and defined by the first insulating encapsulation 230 and the first semiconductor substrate 110. The first insulating encapsulation 230 is covered by the protection layer PLC during the etching process so that the contamination on the etching chamber caused by the material of the first insulating encapsulation 230 is prevented. The protection layer PLC is made of photoresist material in the embodiment and may be removed after the etching process.

Figure 4B:
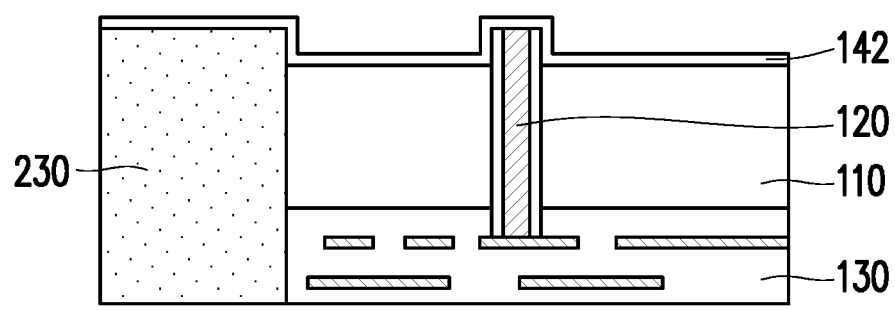

FIG. 4B schematically shows that the protection layer PLC is removed and the first isolation layer 142 is formed. The first isolation layer 142 may conformally cover the first semiconductor substrate 110, the through silicon via 120, and the first insulating encapsulation 230. The first isolation layer 142 may be in direct contact with the first insulating encapsulation 230 since the protection layer PLC shown in FIG. 4A is removed prior to the formation of the first isolation layer 142. Similar to the previous embodiments, the first isolation layer 142 may be made of oxide, nitride or a combination thereof. For example, the first isolation layer 142 may be made of low temperature silicon nitride by a depositing process.

Figure 4C:
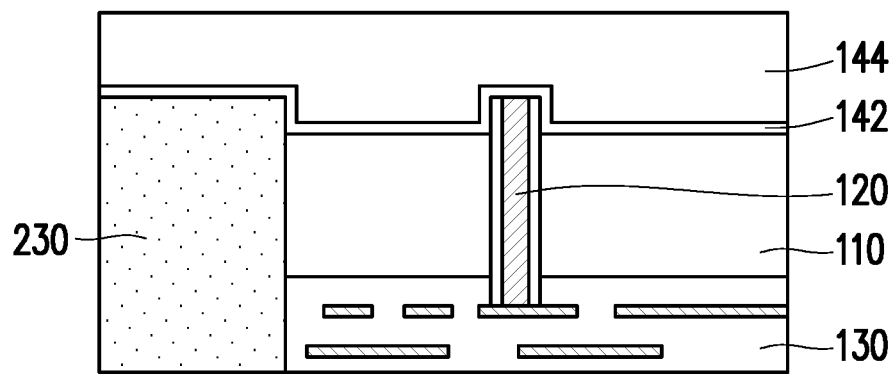

In FIG. 4C, a second isolation layer 144 may be formed on the first isolation layer 142. The material of the second isolation layer 144 may be low temperature polyimide. The second isolation layer 144 may be formed on the first isolation layer 142 by a coating process. The thickness of the second isolation layer 144 may be thick so that the uneven structure caused by the first semiconductor substrate 110, the through silicon via 120, and the first insulating encapsulation 230 is compensated, which facilitates the subsequent grinding process.

Figure 4D:
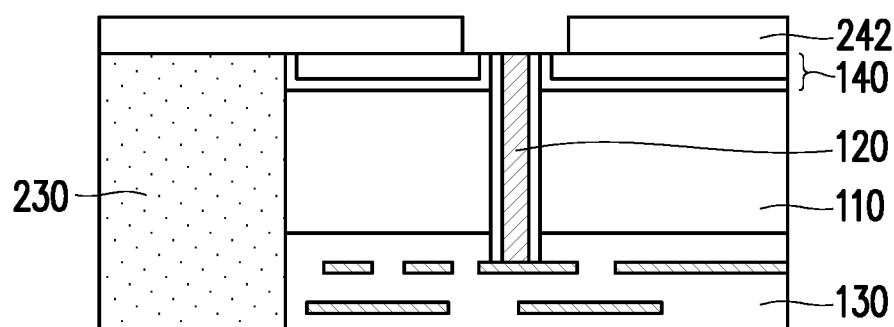

The structure of FIG. 4C is ground to reduce the thickness of the second isolation layer 144 until the through silicon via 120 as well as the first insulating encapsulation 230 are exposed and a dielectric layer 242 is formed as shown in FIG. 4D. After the grinding process, an isolation layer 140 including the first isolation layer 142 and the second isolation layer 144 is formed. The first isolation layer 142 has a U-shaped cross section and the second isolation layer 144 fills the U-shaped cross section. The dielectric layer 242 is disposed on the first insulating encapsulation 230 and the isolation layer 140. The material of the dielectric layer 242 may be the same as the second isolation layer 144, for example, a low temperature polyimide. In some embodiments, the first isolation layer 142 may be omitted so that the isolation layer 140 is a single layer structure formed by the material of low temperature polyimide.

Figure 4E:
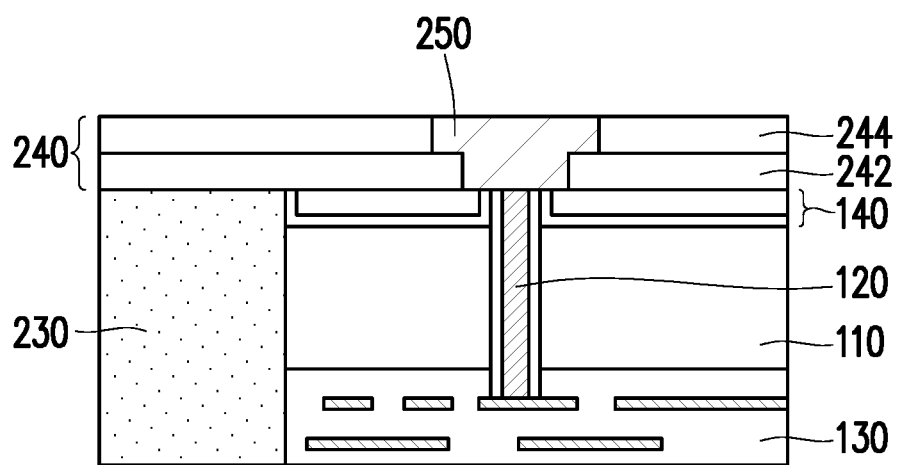

In FIG. 4E, a conductor structure 250 and another dielectric layer 244 may be formed on the dielectric layer 242 in sequence. The conductor structure 250 contacts the through silicon via 120 at the opening of the dielectric layer 242. The conductor structure 250 may be a copper via, a copper linear via, or the like. The dielectric layer 244 encircles the conductor structure 250 and the dielectric layer 242 and the dielectric layer 244 together construct a dielectric layer structure 240. After forming the conductor structure 250 and the dielectric layer 244, a grinding and/or planarization process may be performed, and the conductor structure 250 may be coplanar with the dielectric layer structure 240 while the conductor structure 250 extends through the dielectric layer structure 240. The structure of FIG. 4E may serve as an embodiment of the structure of FIG. 1D.

Figure 5:
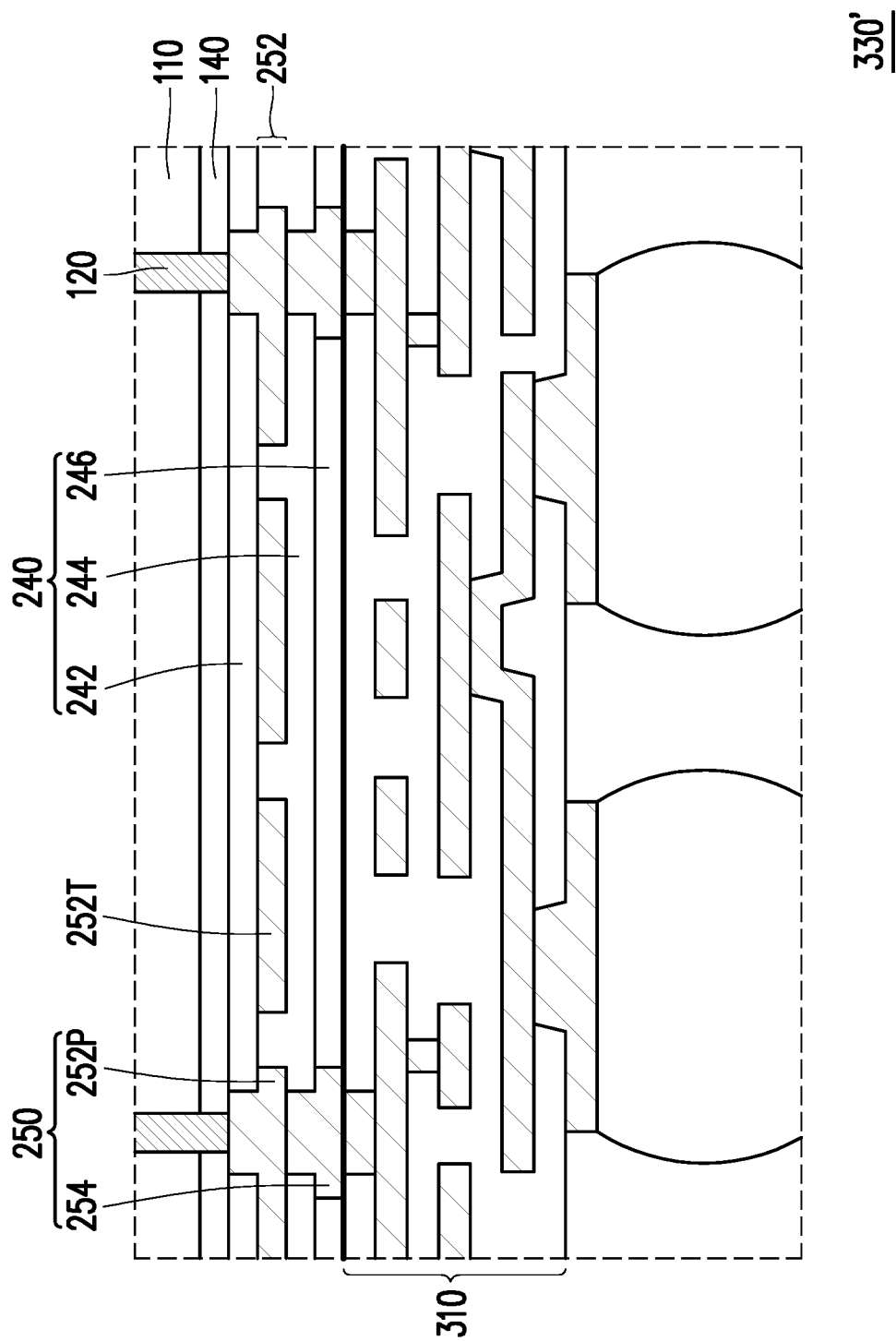
FIG. 5 schematically illustrates an enlarged portion V of the semiconductor package in FIG. 1G in accordance with some embodiments of the disclosure.

FIG. 5 schematically illustrates an enlarged portion V of the semiconductor package in FIG. 1G in accordance with some embodiments of the disclosure. In some embodiments, the semiconductor package 330' may be similar to the semiconductor package 330 in FIG. 1G, and further include a thermal enhance layer 252 disposed on the first semiconductor substrate 110 and a conductive via 254. In addition, the dielectric layer structure 240' includes the dielectric layer 242 and the dielectric layer 244 that are described in the previous embodiments, and further includes a dielectric layer 246.

In the semiconductor package 330', the dielectric layer 242 is formed on the isolation layer 140 on the first semiconductor substrate 110 without covering the terminal of the through silicon via 120 that passes through the first semiconductor substrate 110. The thermal enhance layer 252 is formed on the dielectric layer 242 and made of a material that has good thermal dissipation property. The thermal enhance layer 252 may have a thickness of 3 µm~15 µm. In some embodiments, the material of the thermal enhance layer 252 includes copper, or the like. The thermal enhance layer 252 may include a pad portion 252P that extends through the dielectric layer 242 to contact the through silicon via 120 and a thermal conduction portion 252T that is separated from the pad portion 252P and distributes on the first semiconductor substrate 110. The dielectric layer 244 is formed on the dielectric layer 242 without covering the pad portion 252P. The conductive via 254 is formed on the dielectric layer 244 and in contact with the pad portion 252P of the thermal enhance layer 252. The dielectric layer 246 is disposed on the dielectric layer 244 without covering the conductive via 254. The dielectric layers 242, 242 and 246 form the dielectric layer structure 240' and the pad portion 252P and the conductive via 254 form the conductor structure 250 that extends through the dielectric layer structure 240' and electrically connected to the through silicon via 120 in the first semiconductor substrate 110. The surface of the conductive via 254 may be coplanar with the surface of the dielectric layer 246. The thermal enhance layer 252 may provide a thermal conduction property so that the generated heat in the semiconductor package 330' may be dissipated efficiently so as to improve the performance and the reliability of the semiconductor package 330'.

Figure 6A:
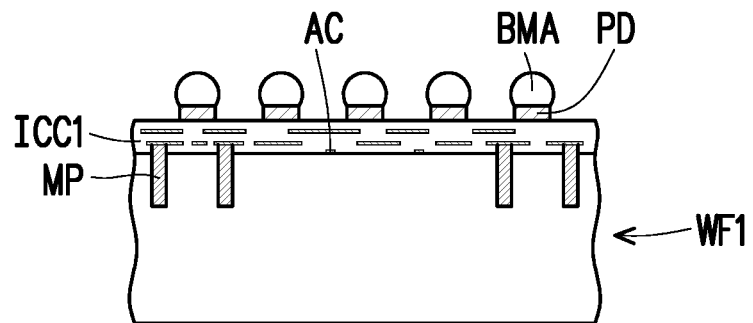
FIG. 6A through FIG. 6L schematically illustrate a method of fabricating a semiconductor package in accordance with some embodiments of the disclosure.

FIG. 6A through FIG. 6L schematically illustrate a method of fabricating a semiconductor package in accordance with some embodiments of the disclosure. In FIG. 6A, a first semiconductor wafer WF1 is provided. A metal pillar MP is formed in the first semiconductor wafer WF1 and extends from a surface of the first semiconductor wafer WF1 into a certain depth of the first semiconductor wafer WF1. In addition, an interconnect circuit structure ICC1 is formed on the surface of the first semiconductor wafer WF1 and the interconnect circuit structure ICC1 is formed on the metal pillar MP and electrically connected to the metal pillar MP.

The formation of the metal pillar MP may include forming a deep opening in the first semiconductor wafer WF1, forming a liner in the deep opening, and filling metallic materials into the remaining portion of the deep opening. The deep opening often has high aspect ratios and extends from the surface of the first semiconductor wafer WF1 into a certain depth of the first semiconductor wafer WF1. Active components AC and/or the passive components may be formed on the first semiconductor wafer WF1 through front end of line (FEOL) fabrication processes of semiconductor wafer. The deep opening extends into the first semiconductor wafer WF1 to a depth at least further than the active devices AC, and may extend to a depth greater than the eventual desired height of the first semiconductor wafer WF1. A depth of the deep opening may be between about 20 µm and about 200 µm. In some embodiments, the deep opening may have a depth of about 100 µm from the active devices AC on the first semiconductor wafer WF1. The liner may be conformal to the shape of the deep opening and continuously extend along the vertical wall of the deep opening and the bottom of the deep opening. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. The metallic material fills the remaining portion of the deep opening and is thus the metallic material and the first semiconductor wafer WF1 are isolated by the liner. In other words, the metallic material is not in contact with the first semiconductor wafer WF1. The material of the metallic material may include a conductive material, such as copper or alternatively, aluminum, tungsten, silver, gold or doped polysilicon. A grinding and/or planarization process such as a chemical grinding process, a mechanical grinding process, or a combination thereof may be performed to remove excess materials of the metallic material and the liner to form the metal pillar MP.

The interconnect circuit structure ICC1 may be formed on the first semiconductor wafer WF1 and the metal pillar MP. The interconnect circuit structure ICC1 may include metal lines and vias (not shown) formed in dielectric layers, which may be low-k dielectric layers. The metal lines and vias may be electrically connected to metal pillar MP. The interconnect circuit structure ICC1 may also include passivation layers, bond pads (not shown), and the like. In addition, the outermost interconnect wirings in the interconnect circuit structure ICC1 may include conductive pads PD, and the conductive pads PD may be aluminum pads, copper pads, or other suitable metallic pads.

Connectors BMA are formed on the conductive pads PD, respectively. The connectors BMA may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors BMA may include a conductive material such as solder, copper, aluminum, gold, nickel, silver, palladium, tin, the like, or a combination thereof. In some embodiments, the connectors BMA include a eutectic material and may include a solder bump or a solder ball, as examples. In some embodiments, the connectors BMA include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 6B:
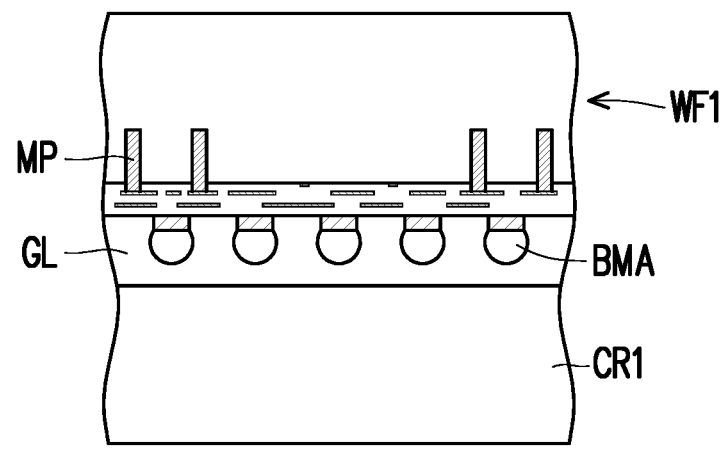

In FIG. 6B, the first semiconductor wafer WF1 is temporally attached to a carrier CR1 through a glue layer GL. The first semiconductor wafer WF1 is oriented that the connectors BMA face the carrier CR1. The glue layer GL may surround the connectors BMA. The carrier CR1 may carry the first semiconductor wafer WF1 in the subsequent processing procedure. For example, a TSV (through silicon via) reveal process is performed on the first semiconductor wafer WF1 carried in by the carrier CR1. In the TSV reveal process, the first semiconductor wafer WF1 carried by the carrier CR1 may subject to a backside grinding process until the metal pillar MP is exposed at the back side that is opposite to the side of the connector BMA, a planarization process polishing the surface of the ground first semiconductor wafer WF1 and the ground metal pillar MP, an etching process of removing a portion of the first semiconductor substrate to form a concave structure revealing the metal pillar MP, a cleaning process, a process of forming an isolation layer filling the concave structure, a further planarization process, and a cleaning process in sequence. In some embodiments, the planarization process may include chemical and mechanical polishing (CMP), but is not limited thereto. Thereby, the structure of FIG. 6C is formed.

Figure 6C:
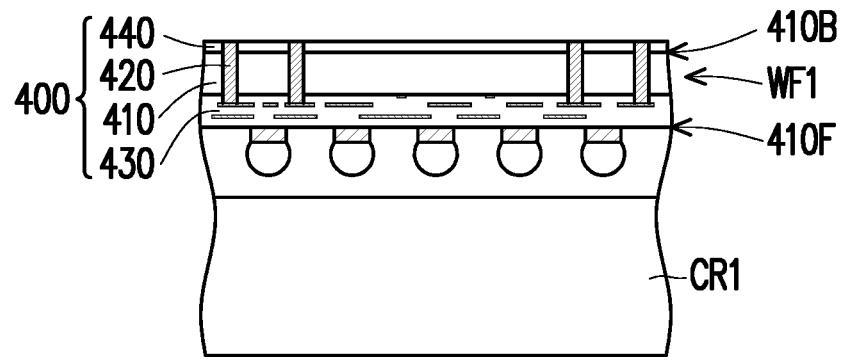

In FIG. 6C, a first semiconductor die 400 is formed and includes a first semiconductor substrate 410, a through silicon via 420 and an interconnect circuit structure 430. The thinned first semiconductor wafer WF1 defines the first semiconductor substrate 110. A portion of the metal pillar MP is protruded from the first semiconductor substrate 410 at the back side 410B to form the through silicon via 420. The interconnect circuit structure ICC1 corresponding to the first semiconductor substrate 410 is defined as the interconnect circuit structure 430 of the first semiconductor die 400. In addition, the first semiconductor die 400 further includes an isolation layer 440 covering the back side 410B of the first semiconductor substrate 410 and encircling the protruded portion of the through silicon via 420. The terminal of the through silicon via 420 is coplanar with the surface of the isolation layer 440. In some embodiments, the isolation layer 440 may be made of oxide, nitride, or a combination thereof. The isolation layer 440 may be a silicon nitride layer that is deposited on the first semiconductor substrate 410. In some alternative embodiments, the isolation layer 440 may be made of low temperature polyimide.

Figure 6D:
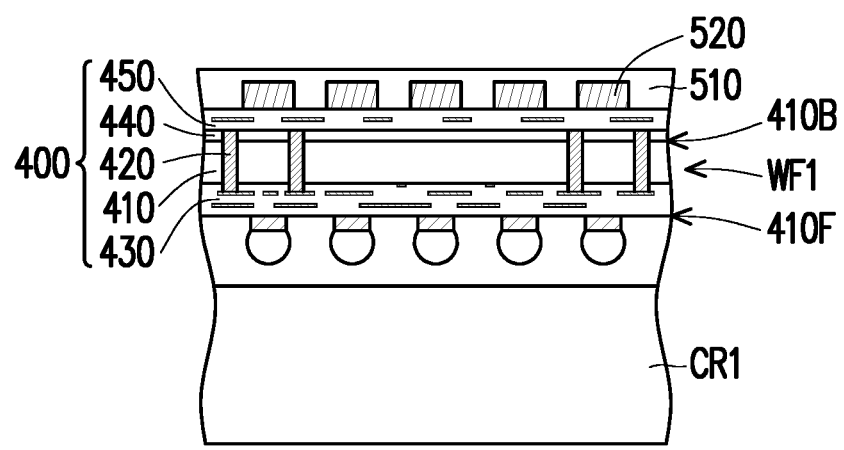

In FIG. 6D, another interconnect circuit structure 450 is formed on the first semiconductor substrate 410 over the isolation layer 440. The first semiconductor die 400 may include the interconnect circuit structure 430 formed at the front side 410F of the first semiconductor substrate 410, the interconnect circuit structure 450 formed at the back side 410B of the first semiconductor substrate 410, the isolation layer 440 between the interconnect circuit structure 450 and the first semiconductor substrate 410, and the through silicon via 420 extending from the front side 410F to the back side 410B. The through silicon via 420 electrically connect the interconnect circuit structure 430 to the interconnect circuit structure 450.

In addition, a dielectric layer structure 510 and a conductor structure 520 are formed on the first semiconductor die 400. The dielectric layer structure 510 may be made of dielectric material such as low temperature polyimide. The conductor structure 520 may pass through the dielectric layer structure 510 and be electrically connected to the interconnect circuit structure 450 at the back side 410B of the first semiconductor substrate 410. The conductor structure 520 may be a copper via, a copper linear via, or the like. In some embodiments, the dielectric layer structure 510 and the conductor structure 520 may have the structure that is shown in FIG. 5. In other words, a thermal enhance layer may be formed in the dielectric layer structure 510 and the conductor structure 520 may be formed by a pad portion of a thermal enhance layer and a conductive via.

Figure 6E:
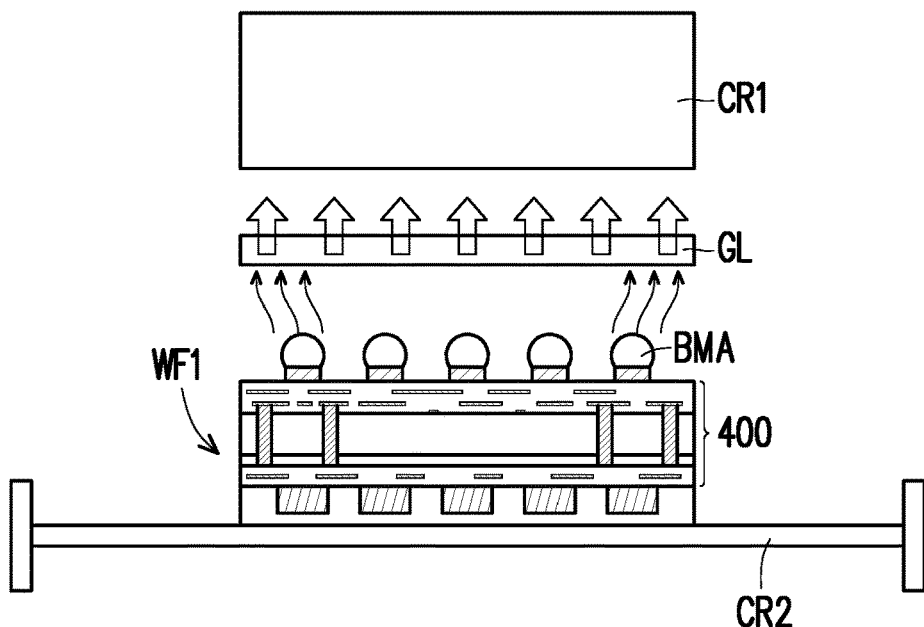

In FIG. 6E, the structure of FIG. 6D is oriented upside down, and the carrier CR1 is separated from the first semiconductor wafer WF1 and supported by another carrier CR2. In addition, the glue layer GL is also removed from the first semiconductor die 400. Thereby, the connectors BMA at the back side 410B of the first semiconductor substrate 410 are exposed. A sawing process is performed on the first semiconductor wafer WF1 to singulate the first semiconductor die 400 from the first semiconductor wafer WF1.

Figure 6F:
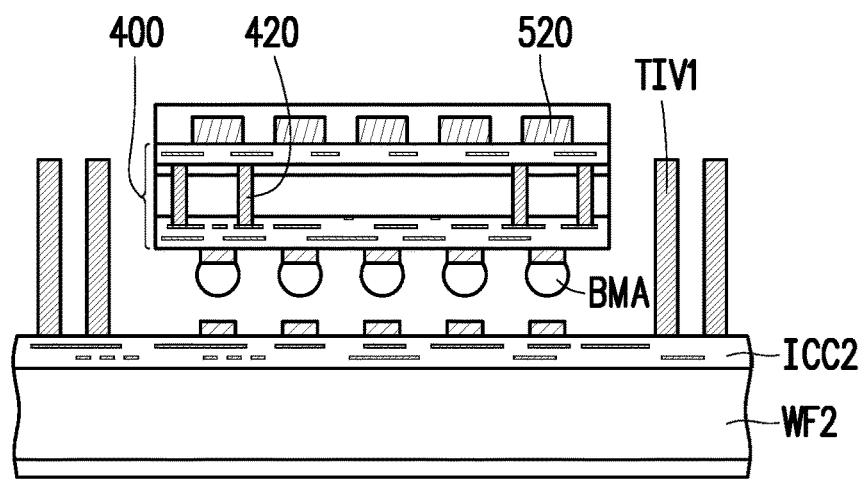

In FIG. 6F, the singulated first semiconductor die 400 with the conductor structure 520 thereon is bonded to a second semiconductor wafer WF2 though a chip-wafer bonding process. The first semiconductor die 400 is oriented that the connectors BMA face the second semiconductor wafer WF2. The first semiconductor die 400 may be bonded to the second semiconductor wafer WF2 by connecting the connectors BMA to the surface pads of the interconnect circuit structure ICC2. In some embodiments, the first semiconductor die 400 may be bonded to the second semiconductor wafer WF2 through a hybrid bonding process so that there may be no gap between the first semiconductor die 400 and the second semiconductor wafer WF2.

The second semiconductor wafer WF2 is formed with an interconnect circuit structure ICC2 thereon and is oriented that the interconnect circuit structure ICC2 face to the first semiconductor die 400. The interconnect circuit structure ICC2 may include metal lines and vias (not shown) formed in dielectric layers, which may be low-k dielectric layers. In addition, through insulation vias TIV1 may be formed on the second semiconductor wafer WF2 and electrically connected to the interconnect circuit structure ICC2. In some embodiments, the through insulation vias TIV1 may be omitted.

Figure 6G:
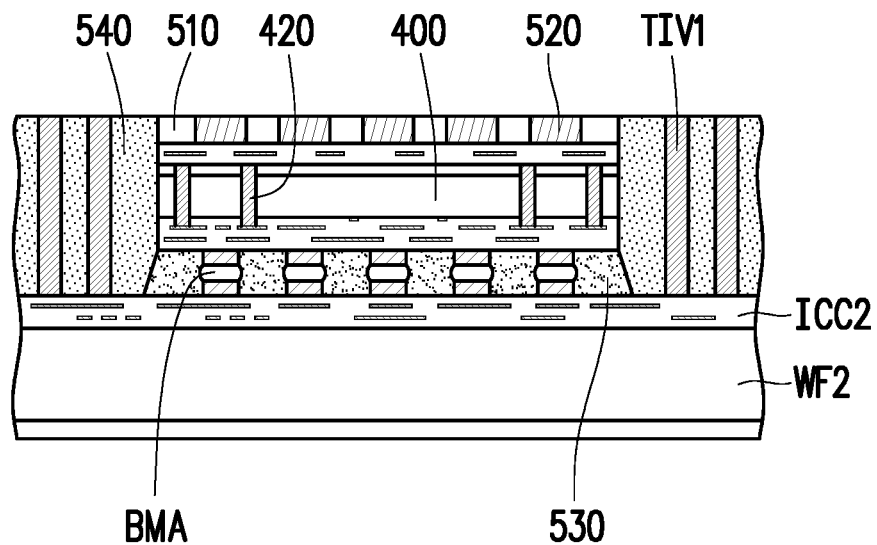

In FIG. 6G, following bonding the first semiconductor die 400 to the second semiconductor wafer WF2 through the connectors BMA, an underfill 530 and a first insulating encapsulation 540 are formed on the second semiconductor wafer WF2. The underfill 530 is formed to seal the connectors BMA and fill the gap between the first semiconductor die 400 and the second semiconductor wafer WF2. In some embodiments, the underfill 530 may be omitted. The first insulating encapsulation 540 encapsulates the first semiconductor die 400, the underfill 530 and the through insulation vias TIV1. The side edge of the first semiconductor die 400, the side edge of the dielectric layer structure 510 and the side edge of the underfill 530 are in contact with and covered by the first insulating encapsulation 540. In addition, a planarization process is performed so that the through insulation vias TIV1 and the conductor structures 520 are exposed. The through insulation vias TIV1 and the conductor structures 520 may be coplanar with the dielectric layer structure 510 and the first insulating encapsulation 540.

Figure 6H:
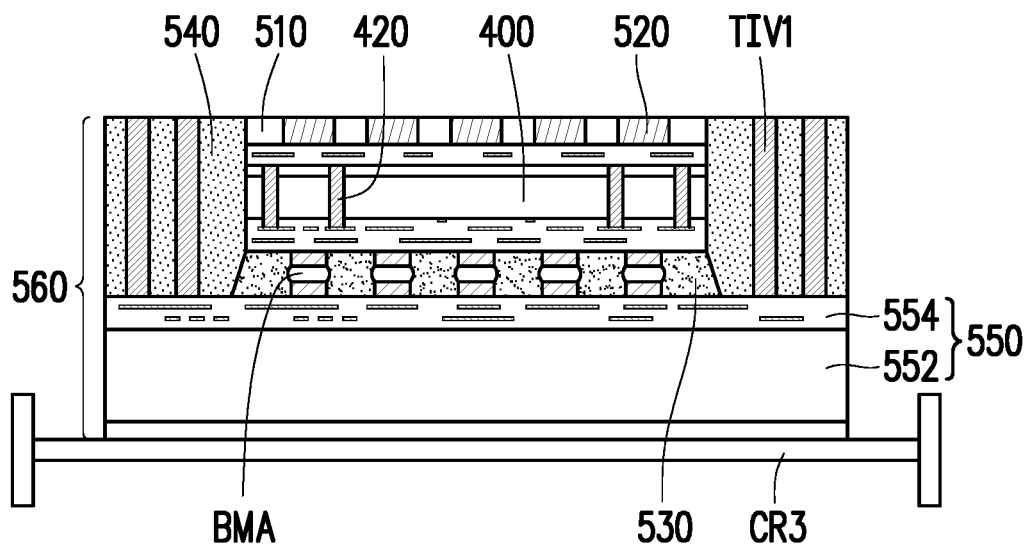

In FIG. 6H, the second semiconductor wafer WF2 in FIG. 6G is thinned from the back side, carried by the carrier CR3 and subjected to a sawing to singulate a second semiconductor die 550 from the second semiconductor wafer WF2 such that a stack structure 560 is formed. The second semiconductor die 550 singulated from the second semiconductor wafer WF2 includes at least a second semiconductor substrate 552 that is a portion of the second semiconductor wafer WF2 in FIG. 6G and an interconnect circuit structure 554 that is a portion of the interconnect circuit structure ICC2 in FIG. 6G. The interconnect circuit structure 554 is disposed on the front side of the second semiconductor substrate 552.

The stack structure 560 includes the first semiconductor die 400 stacking on and bonded to the second semiconductor die 550 through the connectors BMA. The lateral dimension of the first semiconductor die 400 is smaller than the lateral dimension of the first semiconductor die 550. The first semiconductor die 400 and the dielectric layer structure 510 as well as the underfill 530 and the through insulation vias TIV1 are laterally encapsulated by the first insulating encapsulation 540 on the second semiconductor die 550. The second semiconductor die 550 is electrically connected to the first semiconductor die 400 through the connectors BMA. The first semiconductor die 400 has the through silicon via 420 to form an electric conduction path from the front side to the back side. The conductor structure 520 formed at the back side of the semiconductor die 400 is electrically connected to the interconnect circuit structure 450 at the back side of the first semiconductor die 400.

Figure 6I:
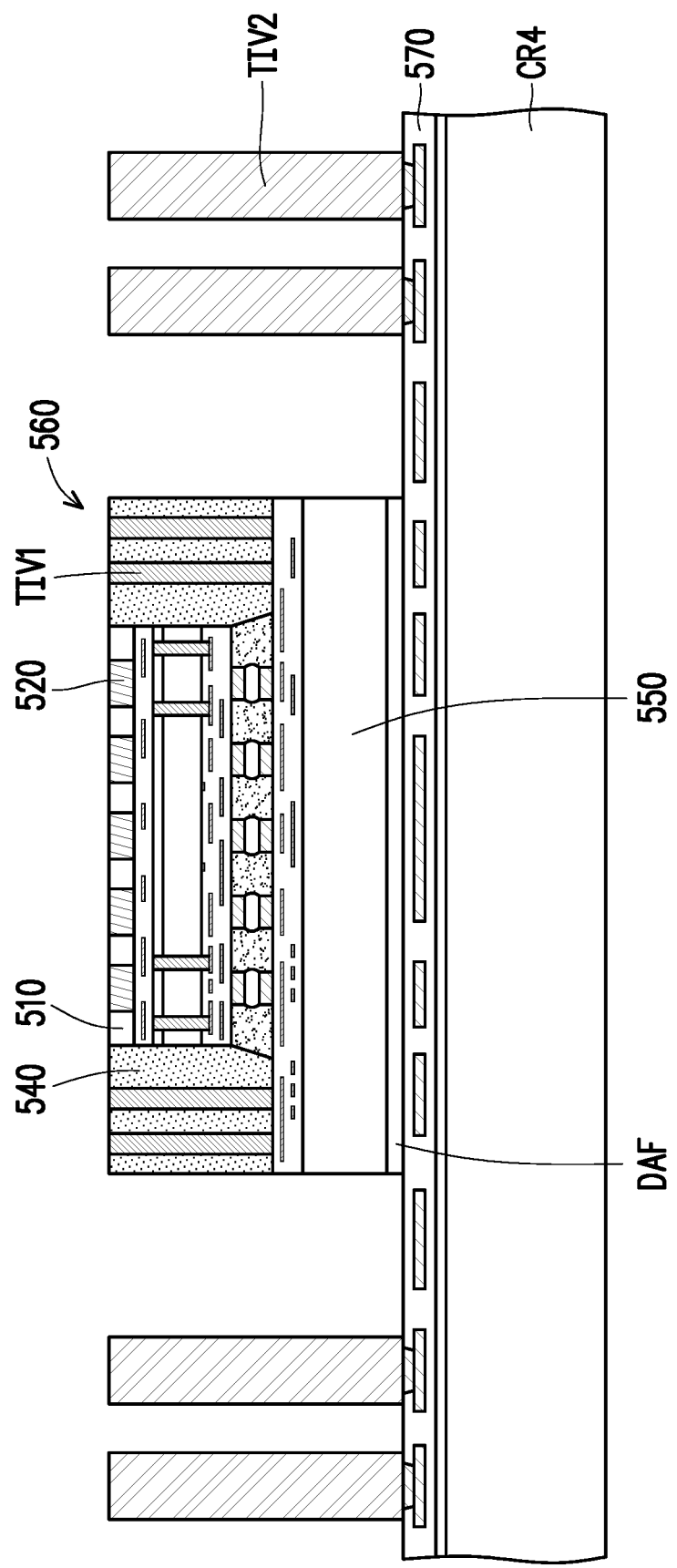

In FIG. 6I, a back side fan-out redistribution circuit structure 570 is formed on a carrier CR4 and the stack structure 560 is attached to the back side fan-out redistribution circuit structure 570 in an orientation that the first insulating encapsulation 540, the conductor structure 520 and the dielectric layer structure 510 formed on the first semiconductor die 400 and the through insulation vias TIV1 face away from the back side fan-out redistribution circuit structure 570. In addition, through insulation vias TIV2 are formed on and electrically connected to the back side fan-out redistribution circuit structure 570. In some embodiments, the stack structure 560 is attached on the back side fan-out redistribution circuit structure 570 using a die attach film DAF to attach the stack structure 560 on the back side fan-out redistribution circuit structure 570 in a manner that the second semiconductor die 550 is located between the first semiconductor die 400 and the back side fan-out redistribution circuit structure 570.

Figure 6J:
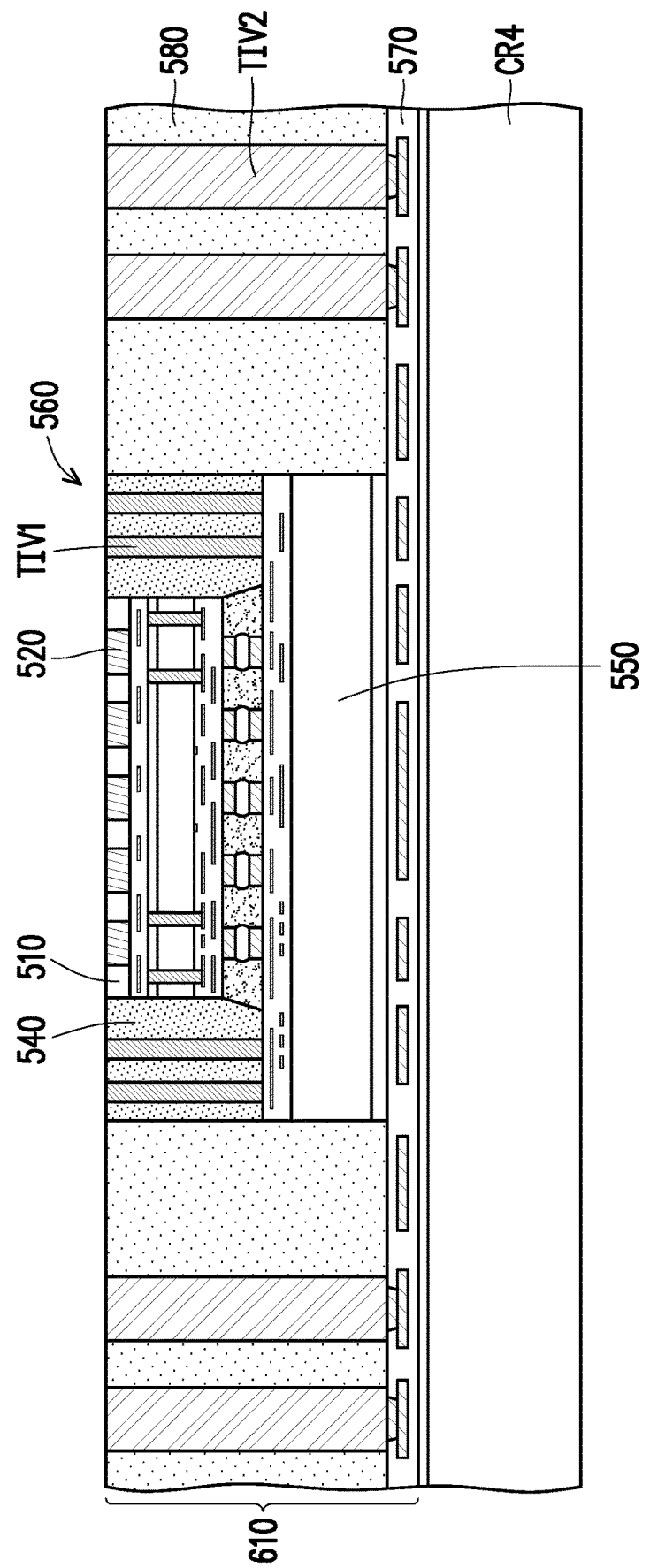

In FIG. 6J, the stack structure 560 is laterally encapsulated by a second insulating encapsulation 580 and the through insulation vias TIV2 are surrounded by the second insulating encapsulation 580. The formation of the second insulating encapsulation 580 may include coating an insulating material such as epoxy polymer or other suitable dielectric materials on the carrier CR4. The amount of the insulating material formed on the carrier CR4 is sufficient to completely cover the through insulation vias TIV2. The insulating material on the carrier CR4 may be cured to encapsulate the stack structure 560 and the through insulation vias TIV2. In addition, a grinding process is performed to remove excess material of the second insulating encapsulation 580 until the through insulation vias TIV2, the through insulation vias TIV1, the dielectric layer structure 510, and the conductor structure 520 are exposed. The through insulation vias TIV2, the through insulation vias TIV1 and the conductor structure 520 may be coplanar with the second insulating encapsulation 580 as well as the first insulating encapsulation 540. The side wall of the first insulating encapsulation 540 and the side wall of the second semiconductor die 550 may be in direct contact with the second insulating encapsulation 580.

Figure 6K:
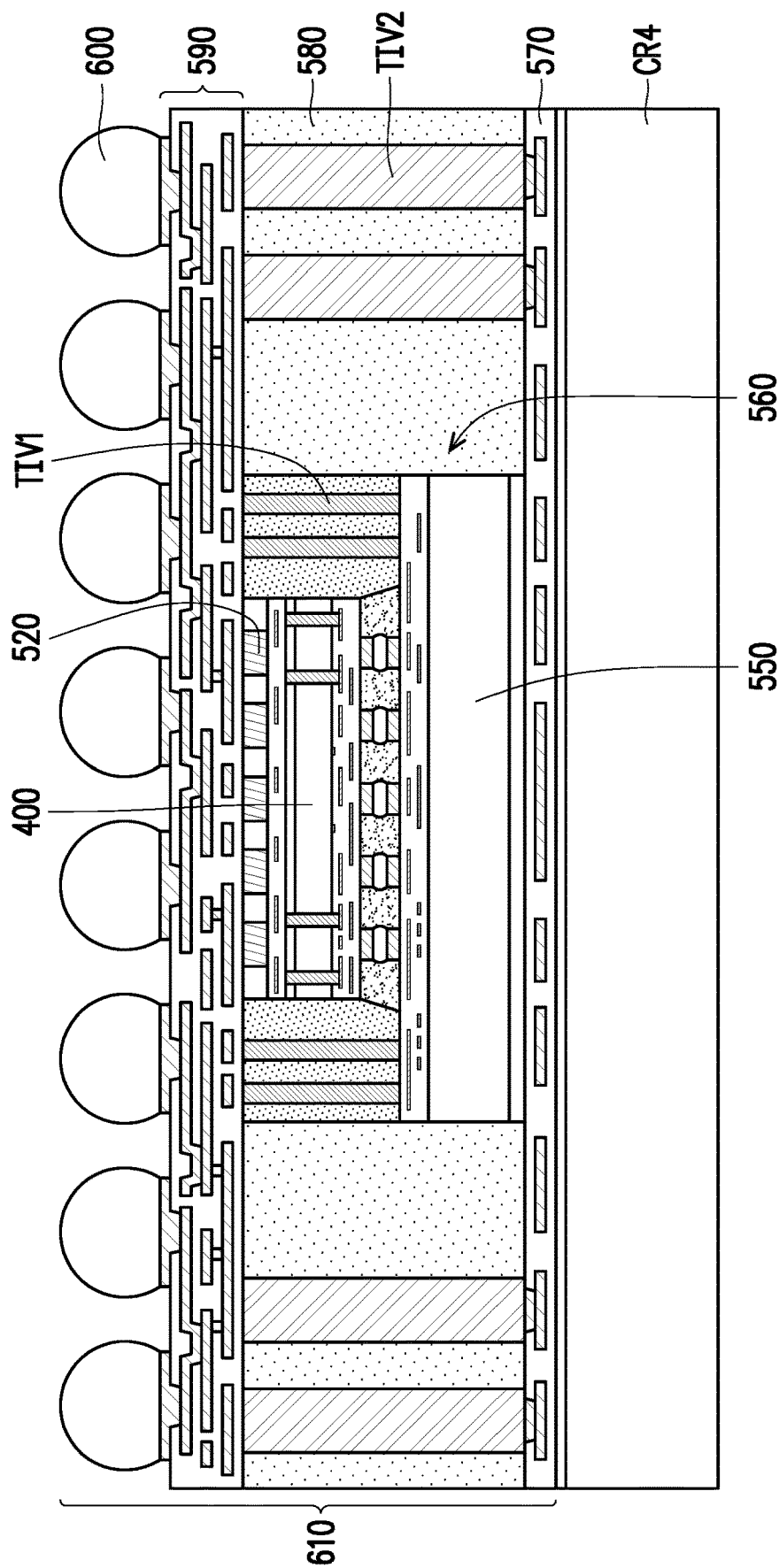

In FIG. 6K, a front side fan-out redistribution circuit structure 590 is formed on the stack structure 560 and the second insulating encapsulation 580. The front side fan-out redistribution circuit structure 590 is electrically connected to the through insulation vias TIV1, the through insulation vias TIV2 and the conductor structure 520. The front side fan-out redistribution circuit structure 590 may be electrically connected to the first semiconductor die 400 through the conductor structure 520, electrically connected to the second semiconductor die 550 through the through insulation vias TIV1 and/or the first semiconductor die 400, and electrically connected to the back side fan-out redistribution circuit structure 570 through the through insulation vias TIV2.

In addition, a bonding structure 600 is formed on the front side fan-out redistribution circuit structure 590. In some embodiments, the bonding structure 600 may include under bump metals, solder balls or the like. The bonding structure 600 may be bonded to an external component such as a circuit board or the like. A semiconductor package 610 is formed on the carrier CR4 and includes the stack structure 560, the second insulating encapsulation 580 laterally encapsulating the stack structure 560, the through insulation vias TIV2 passing through the second insulating encapsulation 580, the back side fan-out redistribution circuit structure 570 formed at a side of the stack structure 560, the front side fan-out redistribution structure 590 formed at an opposite side of the stack structure 560, and a bonding structure 600 formed on the front side fan-out redistribution structure 590.

Figure 6L:
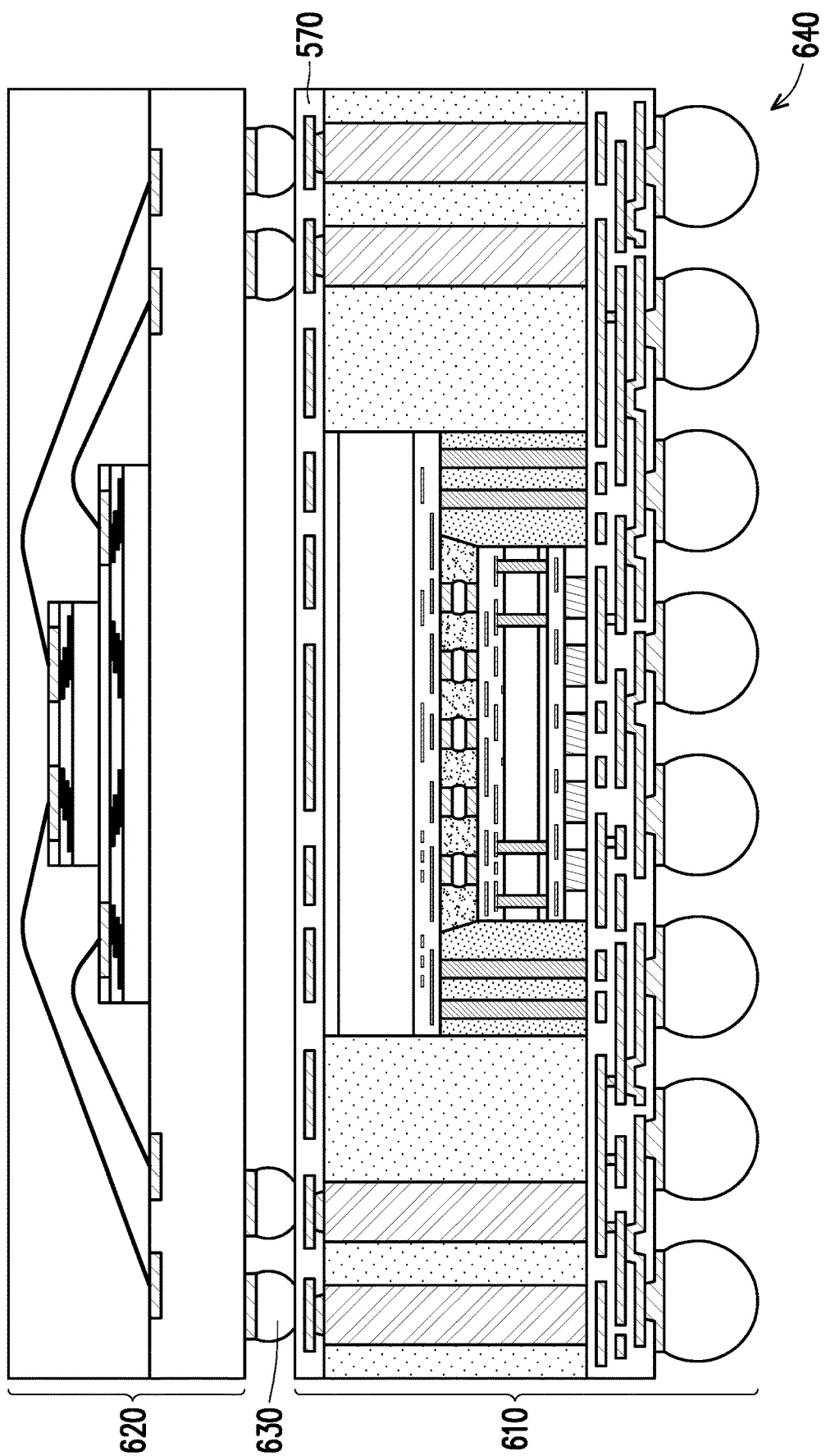

In FIG. 6L, the semiconductor package 610 is separated from the carrier CR4 and is connected to another semiconductor package 620 though bonding structure 630 to form a package-on-package (PoP) structure 640. The semiconductor package 620 may be a DRAM package and electrically connected to the back side fan-out redistribution circuit structure 570 through the bonding structure 630.

Figure 7:
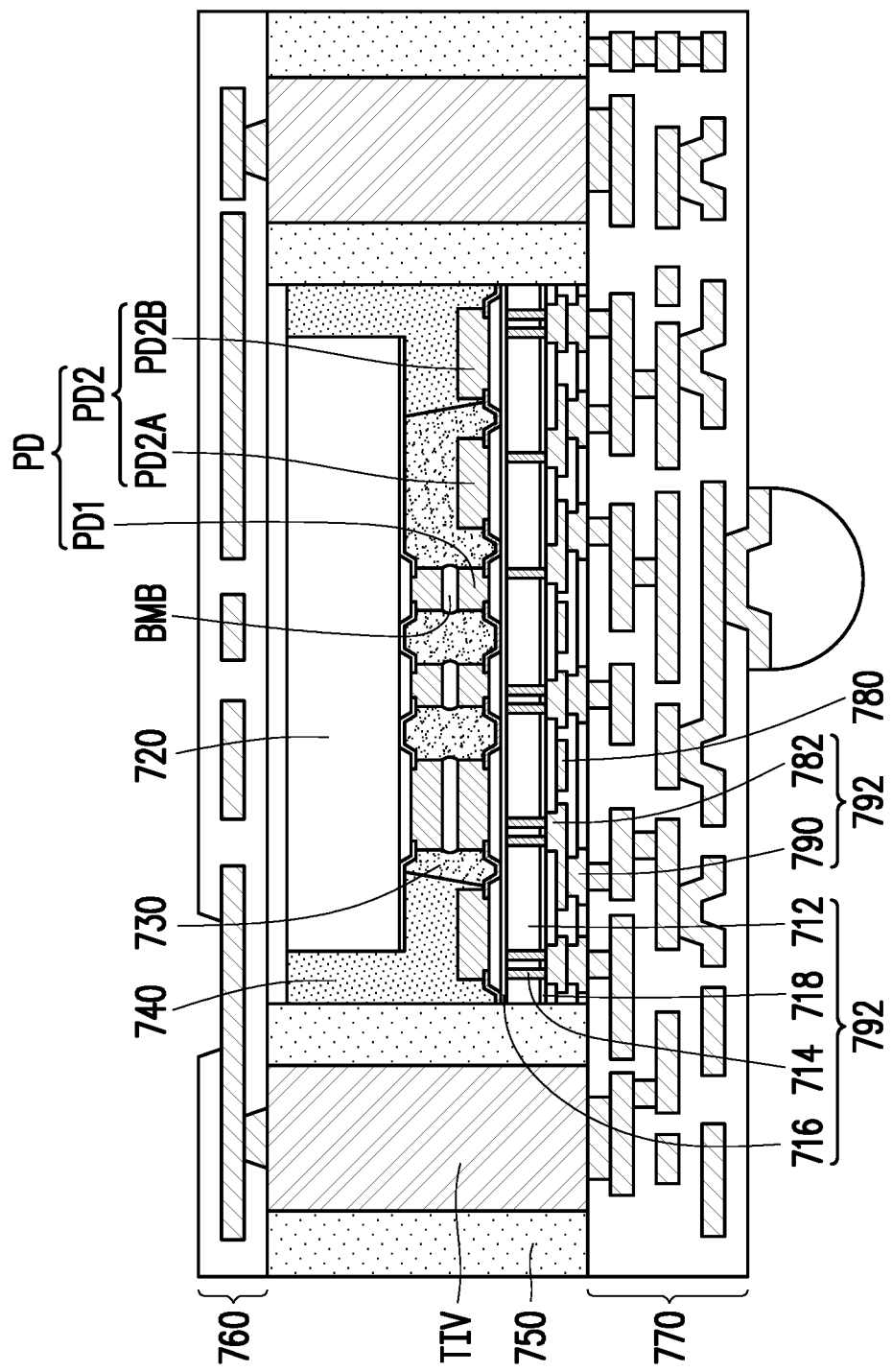
FIG. 7 schematically illustrates a semiconductor package in accordance with some embodiments of the disclosure.

FIG. 7 schematically illustrates a semiconductor package in accordance with some embodiments of the disclosure. A semiconductor package 700 includes a first semiconductor die 710, a second semiconductor die 720, an underfill 730, a first insulating encapsulation 740, a second insulating encapsulation 750, a back side fan-out redistribution circuit structure 760, a front side fan-out redistribution circuit structure 770 and through insulation vias TIV. The lateral dimension of the first semiconductor die 710 may be greater the lateral dimension of the second semiconductor die 720. The second semiconductor die 720 is bonded to the first semiconductor die 710 through connectors BMB. The underfill 730 fills the gap between the first semiconductor die 710 and the second semiconductor die 720 and encircles the connectors BMB. The first insulating encapsulation 740 is disposed on the first semiconductor die 710 to laterally encapsulate the second semiconductor die 720. The second insulating encapsulation 750 encapsulates the first semiconductor die 710 and the first insulating encapsulation 740.

Through insulation vias TIV may be disposed to pass through the second insulating encapsulation 750. The back side fan-out redistribution circuit structure 760 and the front side fan-out redistribution circuit structure 770 may be disposed at opposite sides of the second insulating encapsulation 750 and electrically connected to each other through the through insulation vias TIV.

The first semiconductor die 710 may be fabricated by the above steps of FIGS. 6A to 6E, but the disclosure is not limited thereto. The first semiconductor die 710 includes a first semiconductor substrate 712, a through silicon via 714 passing through the first semiconductor substrate 712, an interconnect circuit structure 716 disposed at a front side of the first semiconductor substrate 712, and an isolation layer 718 disposed at a back side of the first semiconductor substrate 712.

Conductive pads PD may be formed on the front side of the first semiconductor substrate 712. The conductive pads PD may include first conductive pads PD1 bonded to the pads on the second semiconductor die 720 through the connectors BMB and second conductive pads PD2 that is not bonded to the second semiconductor die 720. The second conductive pads PD2 may divide into second conductive pads PD2A and second conductive pads PD2B, wherein the second conductive pads PD2A may be in contact with the underfill 730 and the second conductive pads PD2B may be in contact with the first insulating encapsulation 740. The second bonding pads PD2 are served as testing pads that is bonded to a test card or the like before the formation of the underfill 730 and the first insulating encapsulation 740.

In FIG. 7, a thermal enhance layer 780 may be formed on the isolation layer 718 at the back side of the first semiconductor substrate 712 and conductive via 790 may be formed on the thermal enhance layer 780. The thermal enhance layer 780 may be made of material having good thermal conduction property and may include a pad portion 782 that is in contact with the through silicon via 714. The conductive via 790 is disposed on the pad portion 782 to form a conductor structure 792 that electrically connect the through silicon via 714 to the front side fan-out redistribution circuit structure 770. The structures of the thermal enhance layer 780 and the conductor structure 792 may refer to the above descriptions of the thermal enhance layer 252 and the conductor structure 750 shown in FIG. 5. In some embodiments, the thermal enhance layer 780 may be omitted and thus the conductor structure 792 may be similar to the conductor structure 520 shown in FIG. 6E.

The semiconductor package in accordance with some embodiments may be fabricated by using a TSV (through silicon via) reveal first process such as the steps shown in FIGS. 1A to 1G or a TSV reveal last process such as the steps shown in FIGS. 4A to FIG. 4E. Specifically, in the TSV reveal last process, the first semiconductor die having the through silicon via is encapsulated by the first insulating encapsulation prior to the etching process of removing the first semiconductor substrate surrounding the through substrate via. In some embodiments, one of the method shown in FIGS. 2A to 2I, the method shown in FIGS. 3A to 3G and the method shown in FIG. 4A to 4E may be selected. Therefore, during the etching process, the material of the first insulating encapsulation may least likely be removed or spread in the etching chamber so that the material contamination on the etching chamber may be prevented. In the TSV reveal first process, the etching process of removing the first semiconductor substrate surrounding the through substrate via is performed before encapsulating the first semiconductor die using the first insulating encapsulation. Therefore, no contamination of the encapsulation material on the etching chamber occurs. In some embodiments, the semiconductor package may include thermal enhance layer for improving the thermal dissipation effect so as to ensure the performance of the semiconductor package. In some embodiments, the semiconductor package may include dangling pads that is formed on the front side of the first semiconductor die and is covered by the encapsulation material such as underfill or insulating encapsulation without bonded to the second semiconductor die.

In accordance with some embodiments of the disclosure, a semiconductor package including a first semiconductor die, a second semiconductor die, a first insulating encapsulation, a dielectric layer structure, a conductor structure and a second insulating encapsulation is provided. The first semiconductor die includes a first semiconductor substrate and a through silicon via. The through silicon via extends from a first side of the semiconductor substrate to a second, opposite side of the semiconductor substrate. The second semiconductor die is disposed on the first side of the semiconductor substrate. The first insulating encapsulation is disposed on the second semiconductor die and encapsulates the first semiconductor die. A terminal of the through silicon via is coplanar with a surface of the first insulating encapsulation. The dielectric layer structure covers the first semiconductor die and the first insulating encapsulation. The conductor structure extends through the dielectric layer structure and is in contact with the through silicon via. The second insulating encapsulation laterally encapsulates and is in contact with the second semiconductor die, the first insulting encapsulation, and the dielectric layer structure. In some embodiments, a surface of the second insulating encapsulation is coplanar with a surface of the conductor structure. In some embodiments, the first semiconductor die may further includes an isolation layer disposed between the first semiconductor substrate and the dielectric layer structure, and a surface of the isolation layer may be coplanar with the terminal of the through silicon via. The isolation layer may be made of low temperature polyimide. The isolation layer may include a first isolation layer and a second isolation layer, the first isolation layer may include a planar portion between the second isolation layer and the first semiconductor substrate and a vertical portion vertically extending from a periphery of the planar portion toward a level of the terminal of the through silicon via. The vertical portion may include a first sub portion surrounding the second isolation layer in a top view and a second sub portion surrounding the through silicon via in the top view. In some embodiments the semiconductor package further includes a thermal enhance layer disposed on the first semiconductor substrate and a conductive via disposed on the thermal enhance layer, wherein the thermal enhance layer may include a pad portion connected between the through silicon via and the conductive via, and the conductor structure is formed by the pad portion and the conductive via. The thermal enhance layer may further include a thermal conduction portion that is separated from the pad portion and distributes on the first semiconductor substrate. In some embodiments, the semiconductor package may further include a first fan-out redistribution circuit structure in contact with the dielectric layer structure and the second insulating encapsulation. The semiconductor package may further include a second fan-out redistribution circuit structure, wherein the second semiconductor die is attached to the second fan-out redistribution circuit structure. The first fan-out redistribution circuit structure and the second fan-out redistribution circuit structure may be located at opposite sides of the second insulating encapsulation. In some embodiments, the semiconductor package may further include a through insulation via extending through the second insulating encapsulation, wherein a terminal of the through insulation via is coplanar with the dielectric layer structure and the conductor structure. In some embodiments, the first semiconductor substrate may include a peripheral portion and a thinned portion surrounded by the peripheral portion. The through silicon via is disposed in the thinned portion and a surface of the peripheral portion is coplanar with the terminal of the through silicon via and the surface of the first insulating encapsulation.

In accordance with some other embodiments of the disclosure, a method of fabricating a semiconductor package including the following steps is provided. A first semiconductor substrate having a through silicon via is connected to a second semiconductor substrate. The first semiconductor substrate is encapsulated using a first insulating encapsulation on the second semiconductor substrate. An etching process is performed to remove a portion of the first semiconductor substrate until revealing a portion of the through silicon via while the first insulating encapsulation is covered. A dielectric layer structure is formed on the first semiconductor substrate and the first insulating encapsulation. A conductor structure extending through the dielectric layer structure and electrically connected to the through silicon via is formed. A second insulating encapsulation in contact with a side edge of the second semiconductor substrate, a side edge of the first insulting encapsulation, and a side edge of the dielectric layer structure is formed. In some embodiments, the first insulating encapsulation is covered by a protection layer during the etching process. The method may further include forming an isolation layer, wherein the isolation layer fills a concave structure formed by the etching process and covers the protection layer over the first insulating encapsulation. A grinding process may be further performed until the isolation layer and the protection layer over the first insulating encapsulation are removed and until a terminal of the through silicon via is exposed. The protection layer may include a material the same as the isolation layer or a photoresist material.

In accordance with some other embodiments of the disclosure, a method of fabricating a semiconductor package including the followings is provided. A through silicon via extending through a first semiconductor substrate is form in a semiconductor die. A dielectric layer structure and a conductor structure are formed on the first semiconductor die, wherein the dielectric layer structure covers a first side of the first semiconductor die, and the conductor structure extends through the dielectric layer structure to electrically connect to the through silicon via. The first semiconductor die is connected to a second semiconductor die at a second, opposite side of the first semiconductor die. The first semiconductor and the dielectric layer structure are encapsulated using a first insulating encapsulation on the second semiconductor die. The second semiconductor die and the first insulating encapsulation are encapsulated using a second insulating encapsulation. A portion of the through silicon via may be protruded from the first semiconductor substrate at the first side of the first semiconductor die by a through silicon via reveal process and an isolation layer may be further formed to encircle the protruded portion of the through silicon via. The through silicon via reveal process is performed prior to encapsulating the first semiconductor using the first insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor package, comprising:
   providing a first semiconductor die and the first semiconductor die being formed by forming a through silicon via extending from a first side of a semiconductor substrate to a second, opposite side of the semiconductor substrate;
   attaching a second semiconductor die to the first side of the semiconductor substrate;
   forming a first insulating encapsulation on the second semiconductor die to encapsulate the first semiconductor die;
   forming an isolation layer on the semiconductor substrate and between the through silicon via and the first insulating encapsulation, wherein a side edge of the first semiconductor substrate and a side edge of the isolation layer are aligned with each other;
   forming a dielectric layer structure on the isolation layer and the first insulating encapsulation;
   forming a conductor structure extending through the dielectric layer structure and in contact with the through silicon via; and
   forming a second insulating encapsulation laterally encapsulating and laterally in contact with the second semiconductor die, the first insulating encapsulation, and the dielectric layer structure.

2. The method as claimed in claim 1, wherein the second insulating encapsulation is formed coplanar with a surface of the conductor structure.

3. The method as claimed in claim 1, wherein the isolation layer is formed coplanar with a terminal of the through silicon via.

4. The method as claimed in claim 3, wherein the forming the isolation layer comprises forming a first isolation layer and a second isolation layer, the first isolation layer comprises a planar portion between the second isolation layer and the semiconductor substrate and a vertical portion vertically extending from a periphery of the planar portion toward a level of the terminal of the through silicon via.

5. The method as claimed in claim 4, wherein the vertical portion is formed to comprise a first sub portion surrounding the second isolation layer in a top view and a second sub portion surrounding the through silicon via in the top view.

6. The method as claimed in claim 1, further forming a thermal enhance layer on the semiconductor substrate and a conductive via disposed on the thermal enhance layer, wherein the thermal enhance layer comprises a pad portion connected between the through silicon via and the conductive via, and the conductor structure is formed by the pad portion and the conductive via.

7. The method as claimed in claim 6, wherein the forming the thermal enhance layer comprises further forming a thermal conduction portion that is separated from the pad portion and distributes on the semiconductor substrate.

8. The method as claimed in claim 1, further forming a first fan-out redistribution circuit structure in contact with the dielectric layer structure and the second insulating encapsulation.

9. The method as claimed in claim 8, further forming a second fan-out redistribution circuit structure, wherein the second semiconductor die is attached to the second fan-out redistribution circuit structure, and the first fan-out redistribution circuit structure and the second fan-out redistribution circuit structure are located at opposite sides of the second insulating encapsulation.

10. The method as claimed in claim 1, further forming a through insulation via extending through the second insulating encapsulation, wherein a terminal of the through insulation via is coplanar with the dielectric layer structure and the conductor structure.

11. The method as claimed in claim 1, wherein the semiconductor substrate comprises a peripheral portion and a thinned portion surrounded by the peripheral portion, the through silicon via is formed in the thinned portion and a surface of the peripheral portion is coplanar with a terminal of the through silicon via and the surface of the first insulating encapsulation.

12. A method of fabricating a semiconductor package, comprising:
bonding a first semiconductor substrate having a through silicon via to a second semiconductor substrate;
encapsulating the first semiconductor substrate using a first insulating encapsulation on the second semiconductor substrate;
performing an etching process to remove a portion of the first semiconductor substrate from a top surface of the first semiconductor substrate while the first insulating encapsulation laterally encapsulates the first semiconductor substrate and exposes the top surface of the first semiconductor substrate during the etching process;
forming a dielectric layer structure on the first semiconductor substrate and the first insulating encapsulation;
forming a conductor structure extending through the dielectric layer structure and electrically connected to the through silicon via; and
forming a second insulating encapsulation in contact with a side edge of the second semiconductor substrate, a side edge of the first insulating encapsulation, and a side edge of the dielectric layer structure.

13. The method as claimed in claim 12, wherein the first insulating encapsulation is covered by a protection layer during the etching process.

14. The method as claimed in claim 13, further forming an isolation layer, wherein the isolation layer fills a concave structure formed by the etching process and covers the protection layer over the first insulating encapsulation.

15. The method as claimed in claim 14, further performing a grinding process until the isolation layer and the protection layer over the first insulating encapsulation are removed and until a terminal of the through silicon via is exposed.

16. The method as claimed in claim 14, wherein the protection layer comprises a material the same as the isolation layer.

17. The method as claimed in claim 13, wherein the protection layer comprises a photoresist material.

18. A method of fabricating a semiconductor package, comprising:
forming a through silicon via extending through a first semiconductor substrate in a first semiconductor die;
forming a dielectric layer structure and a conductor structure on the first semiconductor die, the dielectric layer structure covering a first side of the first semiconductor die, and the conductor structure extending through the dielectric layer structure to electrically connect to the through silicon via;
connecting the first semiconductor die to a second semiconductor die at a second, opposite side of the first semiconductor die;
encapsulating the first semiconductor die and the dielectric layer structure using a first insulating encapsulation on the second semiconductor die;
forming an isolation layer on the first semiconductor substrate and between the through silicon via and the first insulating encapsulation, wherein a side edge of the first semiconductor substrate and a side edge of the isolation layer are aligned with each other; and
encapsulating the second semiconductor die and the first insulating encapsulation using a second insulating encapsulation.

19. The method as claimed in claim 18, wherein a portion of the through silicon via is protruded from the first semiconductor substrate at the first side of the first semiconductor die by a through silicon via reveal process and the isolation layer is further formed to encircle a protruded portion of the through silicon via.

20. The method as claimed in claim 19, wherein the through silicon via reveal process is performed prior to connecting the first semiconductor die to the second semiconductor die and encapsulating the first semiconductor die using the first insulating encapsulation.

* * * * *